United States Patent
Kamikawa et al.

[11] Patent Number: 6,068,002
[45] Date of Patent: May 30, 2000

[54] CLEANING AND DRYING APPARATUS, WAFER PROCESSING SYSTEM AND WAFER PROCESSING METHOD

[75] Inventors: Yuji Kamikawa, Kikuchi-gun; Osamu Kuroda, Tosu; Kenji Soejima, Ogi-gun; Tsuyoshi Nomura, Tosu, all of Japan

[73] Assignee: Tokyo Electron Limited, Japan

[21] Appl. No.: 09/046,566

[22] Filed: Mar. 24, 1998

[30] Foreign Application Priority Data

| Apr. 2, 1997 | [JP] | Japan | 9-099803 |
| Apr. 21, 1997 | [JP] | Japan | 9-118784 |

[51] Int. Cl.[7] ........................................ B08B 3/04
[52] U.S. Cl. .................. 134/66; 134/61; 134/95.2; 134/102.3; 134/107; 134/133; 134/902
[58] Field of Search .................. 134/61, 66, 95.2, 134/102.3, 107, 133, 902

[56] References Cited

U.S. PATENT DOCUMENTS

| 4,558,524 | 12/1985 | Peck et al. | 134/902 X |
| 4,777,970 | 10/1988 | Kusuhara | 134/902 X |
| 4,827,867 | 5/1989 | Takei et al. | 134/902 X |
| 5,191,908 | 3/1993 | Hiroe et al. | 134/902 X |
| 5,311,891 | 5/1994 | Uchino | 134/61 X |
| 5,331,987 | 7/1994 | Hayashi et al. | 134/902 X |
| 5,370,142 | 12/1994 | Nishi et al. | 134/902 X |
| 5,520,744 | 5/1996 | Fujikawa et al. | 134/902 X |
| 5,569,330 | 10/1996 | Schild et al. | 134/902 X |
| 5,845,660 | 12/1998 | Shindo et al. | 134/102.3 |

FOREIGN PATENT DOCUMENTS 8-148458 7/1996 Japan .

Primary Examiner—Phillip R. Coe
Attorney, Agent, or Firm—Smith, Gambrell & Russell, LLP Beveridge, DeGrandi, Weilacher & Young

[57] ABSTRACT

A drying unit is disposed above a cleaning tank containing a cleaning liquid for cleaning semiconductor wafers W. A wafer boat holding semiconductor wafers moves between the cleaning tank and the drying unit. The drying unit has a fixed base surrounding an opening formed in the cleaning tank, a liftable top cover placed on the fixed base, and an O-ring interposed between the fixed base and the liftable top cover. The liftable top cover can be moved vertically by a first lifting means.

15 Claims, 24 Drawing Sheets

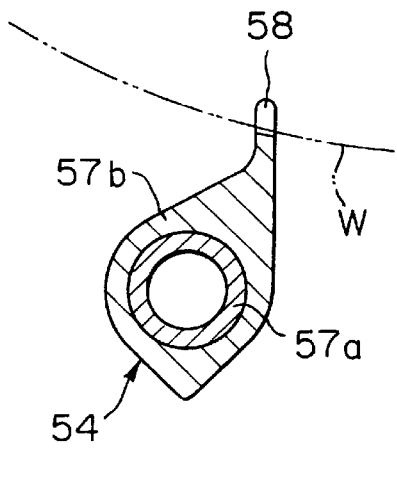 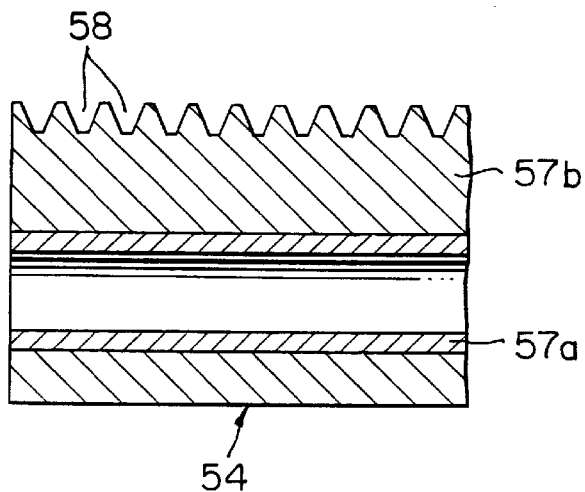
FIG. 9(a)   FIG. 9(b)
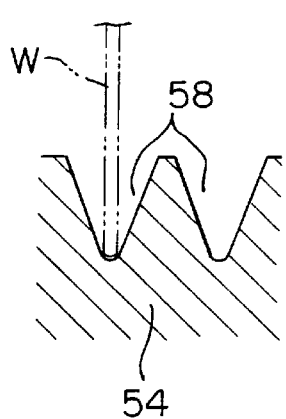 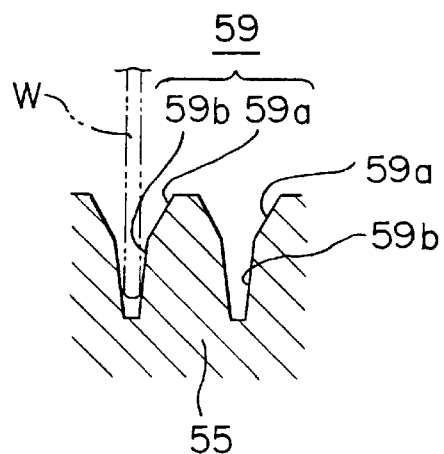
FIG. 10(a)   FIG. 10(b)

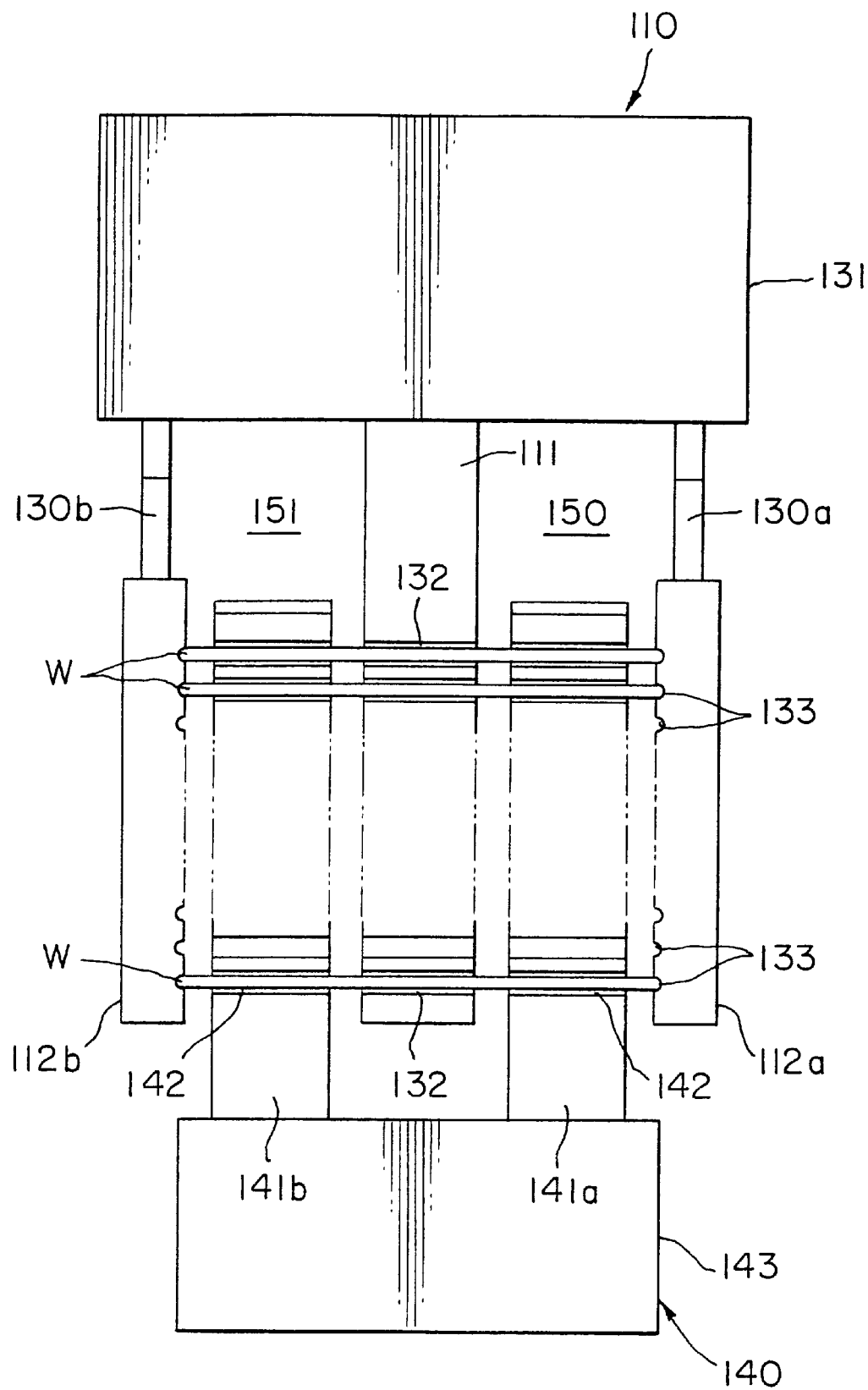
F I G. 25

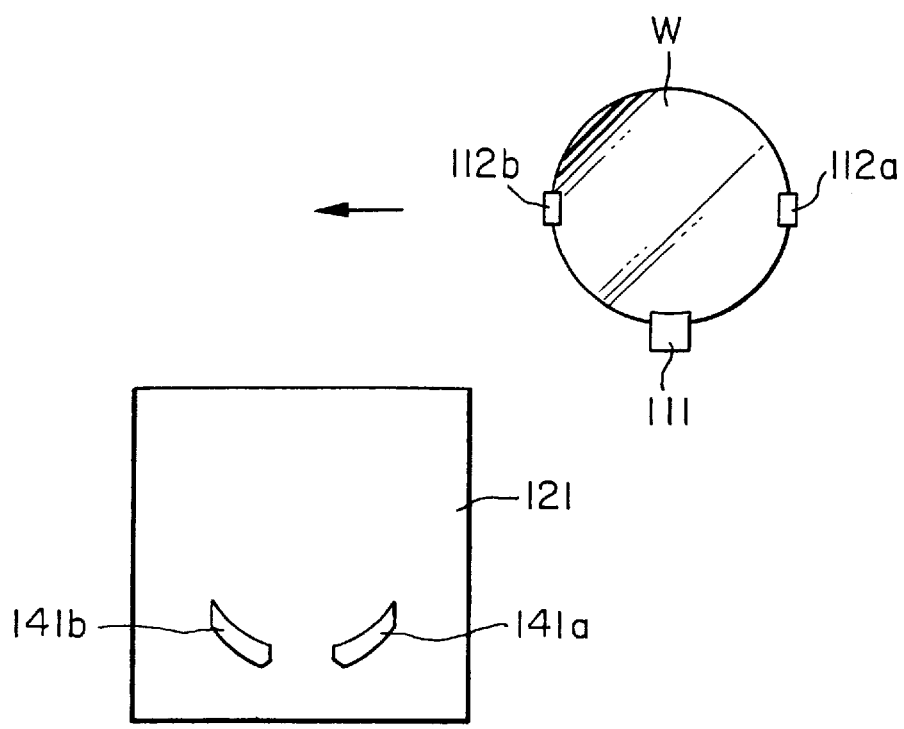
F I G. 26
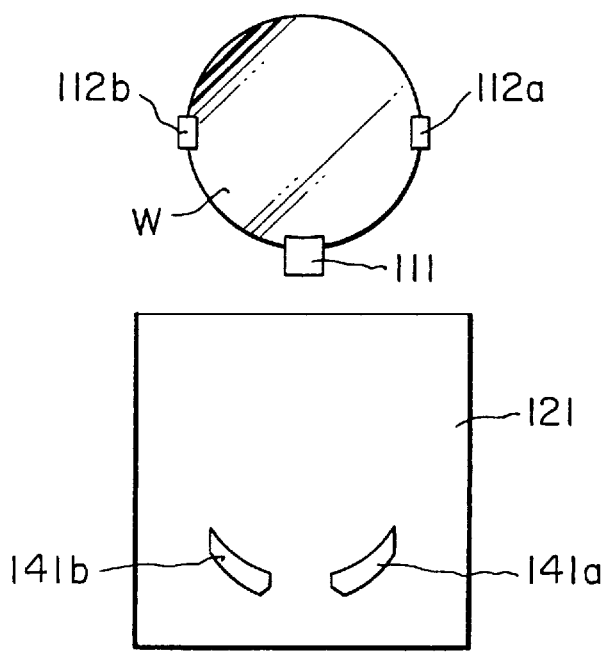
F I G. 27

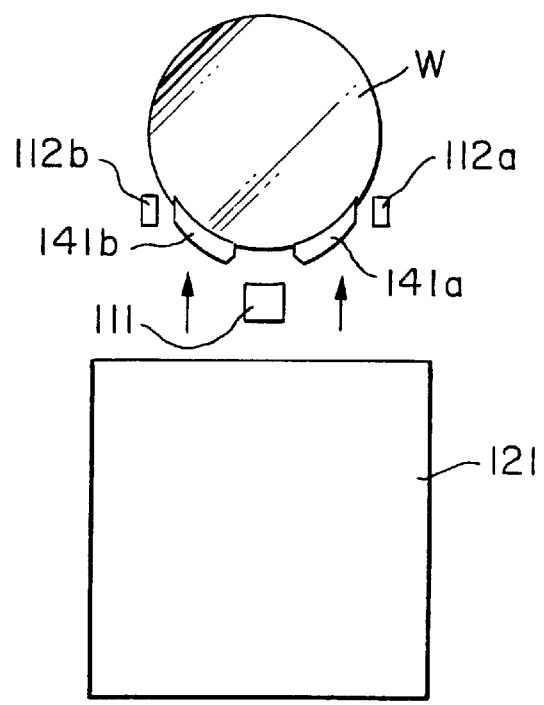
F I G. 28
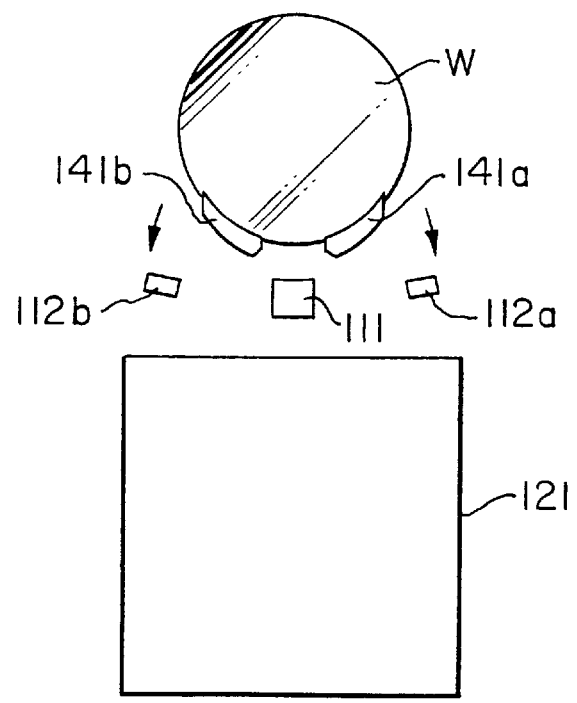
F I G. 29

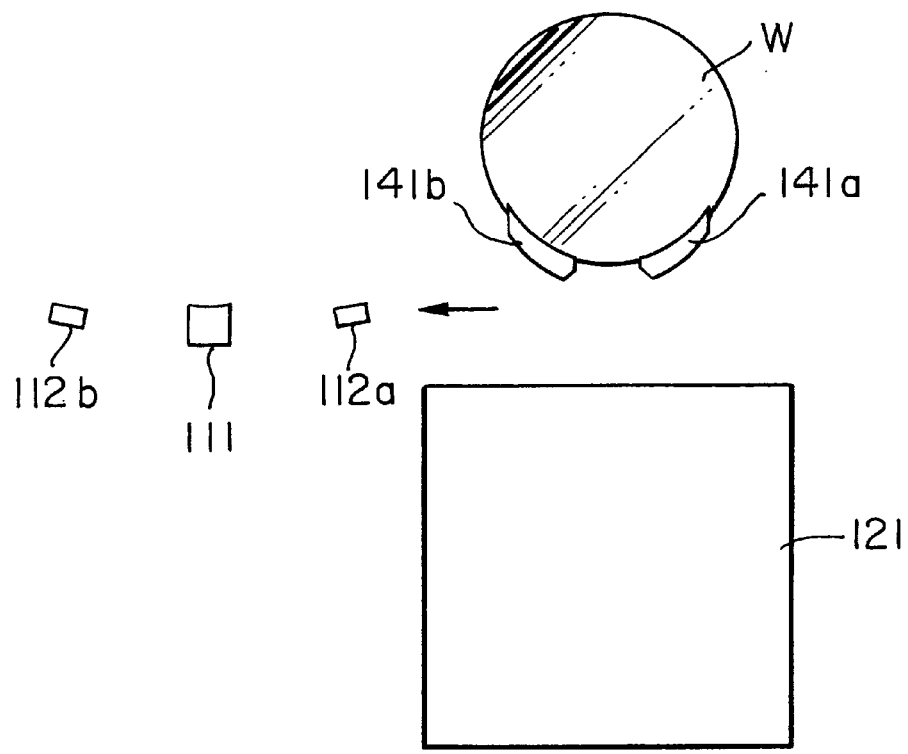
F I G. 30
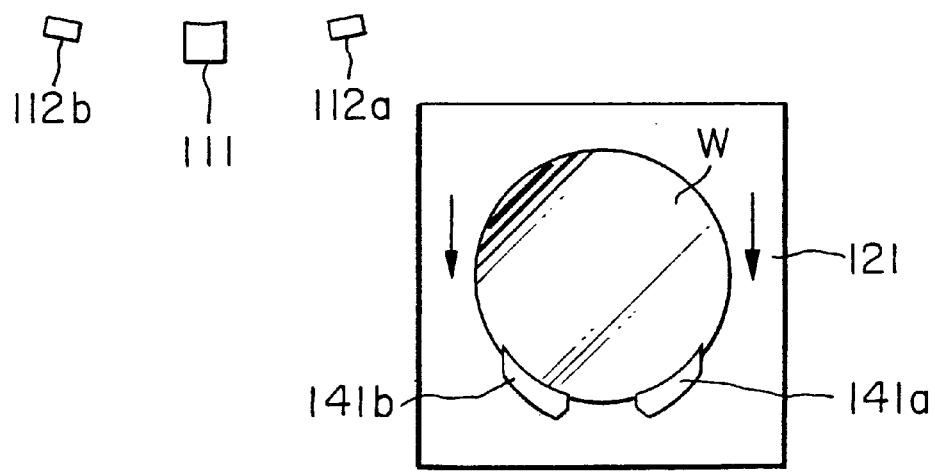
F I G. 31

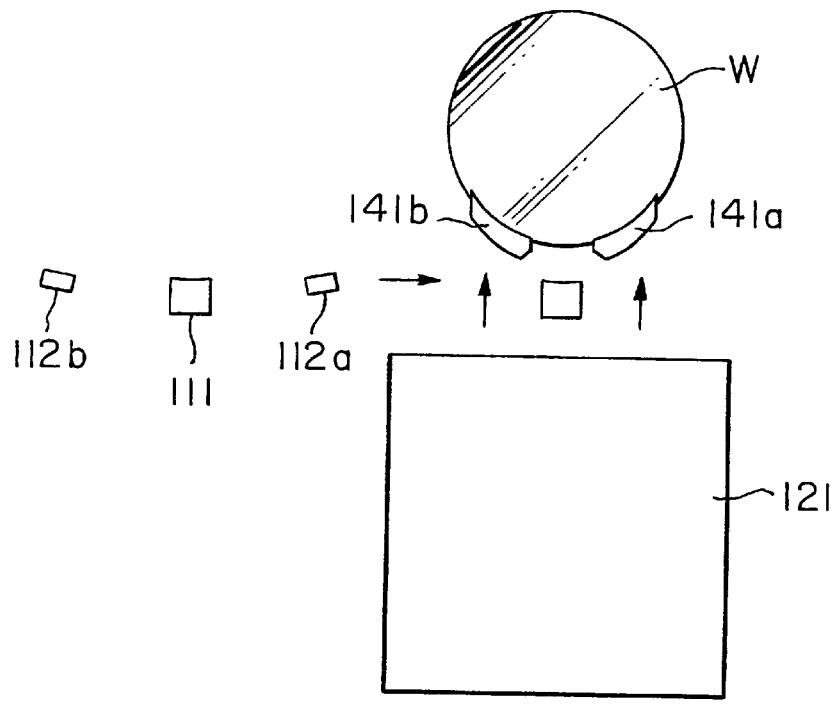
F I G. 32
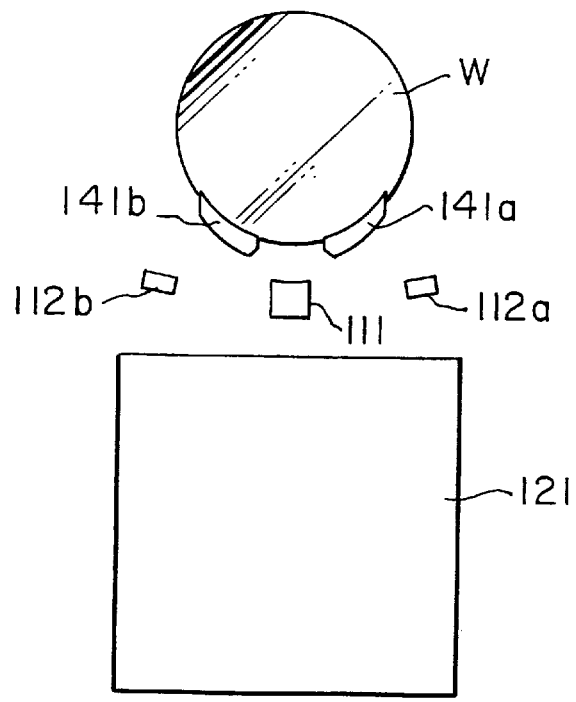
F I G. 33

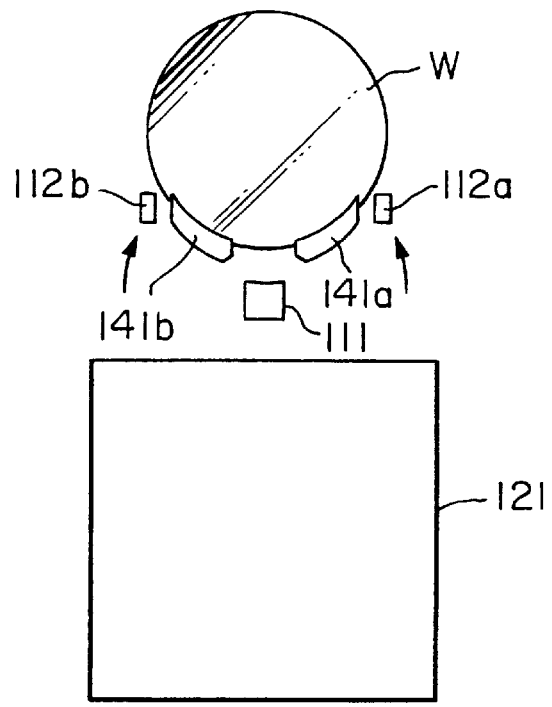
F I G. 34
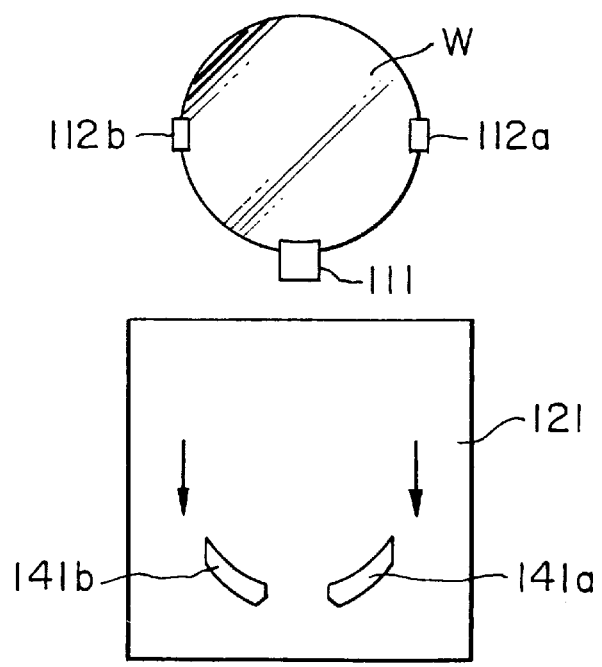
F I G. 35

CLEANING AND DRYING APPARATUS, WAFER PROCESSING SYSTEM AND WAFER PROCESSING METHOD

BACKGROUND OF THE INVENTION

1. Field of the Invention

The present invention relates to a cleaning and drying apparatus for cleaning a wafer to be processed, such as a semiconductor wafer or a glass substrate for LCDs, by immersing the same in a cleaning liquid, and drying the same after cleaning, a wafer processing system, and a wafer processing method.

2. Description of the Related Art

Generally, in a semiconductor device fabricating process to be carried out by a semiconductor device fabricating system, a generally known cleaning method cleans a wafer to be processed (hereinafter referred to simply as "wafer"), such as a semiconductor wafer or a glass substrate for LCDs, by sequentially immersing the wafer in a liquid chemical, a rinsing liquid (cleaning liquid) and such contained in processing tanks. A cleaning system for carrying out such a cleaning method is provided with a drying apparatus which brings a drying gas containing a vapor of a volatile organic solvent, such as isopropyl alcohol, into contact with the surface of the cleaning liquid in order that moisture is removed from the wafer and the wafer is dried by the Marangoni effect. (Refer to JP-A No. 8-148458.)

A conventional cleaning and drying apparatus of this kind includes a cleaning tank storing a cleaning liquid, such as a liquid chemical or a rinsing liquid, having an upper opening covered with a hood (lid). Usually, the lid is made of a strong material, such as polypropylene or a stainless steel, to seal the cleaning tank during a drying process. In this cleaning and drying apparatus, a carrying arm carries a wafer through the open opening into the cleaning tank, transfers the wafer to a wafer supporting means which moves in a transfer unit, and moves out of the cleaning tank. Then, the opening is closed with the lid, the wafer is cleaned in the cleaning tank, and then the wafer is taken out of the cleaning tank for drying.

However, since the wafer is carried into the cleaning tank from above the transfer unit disposed in an upper portion of the cleaning tank, and the wafer is taken out from the cleaning tank after cleaning the wafer by this conventional cleaning and drying apparatus, the carrying arm has a great vertical length (height) and the cleaning and drying apparatus is large. Particularly, there is the trend of change from using 8 in. diameter wafers to using 12 in. diameter wafers for the fabrication of semiconductor devices owing to the progressive miniaturization of semiconductor devices, the advancement of IC complexity to large-scale integration and the progress of mass production in recent years. The use of 12 in. diameter wafers entails the further enlargement of cleaning and drying apparatus and resultant reduction of throughput.

Since the lid and the cleaning tank are made of polypropylene or a stainless steel, particles are liable to be produced, metallic impurities are precipitated or eluted from the lid and the cleaning tank due to aged deterioration. The metallic impurities adhere to wafers to reduce the yield.

SUMMARY OF THE INVENTION

The present invention has been made in view of the foregoing problems and it is therefore an object of the present invention to provide a cleaning and drying apparatus of a small construction capable of carrying out a cleaning process and a drying process and of operating at an improved throughput, a wafer processing system and a wafer processing method.

With the foregoing object in view, a cleaning and drying apparatus according to a first aspect of the present invention comprises a cleaning tank containing a cleaning liquid for cleaning wafers, a drying unit disposed above the cleaning tank and having a drying chamber, and a wafer holding means for holding wafers and moving wafers into the cleaning tank and the drying chamber. The drying unit having the drying chamber, has a fixed base connected to the cleaning tank so as to surround an opening formed in the cleaning tank, and a liftable top cover placed on the fixed base in close contact with the fixed base.

Although the top cover may be of an optional shape provided that the top cover can be vertically moved relative to the fixed base surrounding the opening of the cleaning tank, it is preferable to interpose a sealing member between the fixed base and the top cover and to provide the opening of the cleaning tank with a shutter for isolating a cleaning chamber defined by the cleaning tank, and the drying chamber from each other. Preferably, the top cover is a member made of quartz and having a cross section of a shape resembling the inverted letter U. It is preferable that the top cover is a member made of quartz and having a cross section of a shape resembling the inverted letter U, and both the fixed base and the cleaning tank are made of quartz.

Heating elements can be disposed outside the top cover if the top cover is made of quartz. It is preferable to disposed reflecting plates behind the heating elements if the heating elements are disposed outside the top cover. The heating elements may be, for example, heating lamps or rubber heaters.

Preferably, a drying gas is supplied into the drying chamber by a drying gas supply unit. Preferably, the drying gas supply unit is disposed on the fixed base and, more preferably, the drying gas supply unit is designed so as to supply a drying gas upward from a position on one side of the drying chamber. Preferably, the fixed base of the drying unit is provided with a drying gas discharge unit.

The drying gas may be an inert gas, an organic solvent gas or a mixed gas of an inert gas and an organic solvent gas.

A wafer processing system according to the present invention comprises a cleaning tank containing a cleaning liquid for cleaning wafers, a drying unit having a fixed base connected to the cleaning tank so as to surround an opening formed in the cleaning tank, and a top cover placed on the fixed base in close contact with the fixed base with a sealing member interposed therebetween, and defining a drying chamber, and a wafer holding means for holding wafers and moving wafers into the cleaning tank and the drying chamber, a first lifting means for vertically moving the top cover, and a second lifting means for vertically moving the wafer holding means. The first and the second lifting means are ball screw mechanisms sharing common guide rails.

It is preferable to extend a rod connected to the wafer holding means through a through hole formed in the top cover and to connect the same to the second lifting means, and to seal a gap between the top cover and the rod by a sealing structure having the shape of an airtight, flexible, annular tube, and filled with a gas.

Preferably, the first lifting means is provided with a stopper for limiting the upward movement of the wafer holding means relative to the top cover.

Furthermore, the wafer holding means comprises a pair of lower support members for supporting a plurality of wafers in a vertical position at suitable intervals, and a pair of upper support members disposed beside a region above the lower support members, each of the lower support members has a rigid core and a support block of a synthetic resin resistant to different kinds of cleaning liquids, each of the lower support members is provided with grooves of a substantially V-shaped cross section for receiving wafers therein, and each of the upper support members is provided with grooves of a substantially Y-shaped cross section for preventing the wafers from tilting.

According to the present invention, the drying chamber is defined by the fixed base fixed to the cleaning tank so as to surround the opening of the cleaning tank, and the top cover closely connected to the fixed base, and the top cover can be vertically moved to provide a space through which wafers are carried into the cleaning tank by lifting the top cover. Therefore, wafers can be transferred from a wafer carrying means which moves laterally into the space to the wafer holding means, and from the latter to the former. Accordingly, the cleaning and drying apparatus can be formed in a small construction and is able to operate at a high throughput.

According to the present invention, the volume of the drying chamber can be reduced to the least necessary extent because the top cover is made of quartz in a shape of a cross section resembling the inverted letter U. Consequently, the cleaning and drying apparatus can be built in a further reduced size, the precipitation and dissolution of metallic impurities will not occur and the production of particles can be suppressed. If the fixed base and the cleaning tank, in addition to the top cover, are made of quartz, the production of particles can be further effectively suppressed. Heating lamps may be disposed outside the top cover, and reflecting plates may be disposed behind the heating lamps to heat the drying chamber with the heating lamps, which improves drying efficiency.

According to the present invention, the cleaning and drying apparatus may be provided with a drying gas supply device for supplying a drying gas into the drying chamber to dry the wafer perfectly and quickly by making a drying gas envelop the wafers uniformly.

According to the present invention, the first lifting means for vertically moving the top cover, and the second lifting means for vertically moving the wafer supporting means are ball screw mechanisms sharing common guide rails, which simplifies the construction of driving units for driving the top cover and the wafer support means, and improves the accuracy of driving operations.

A rod connected to the wafer holding means is extended through a through hole formed in the top cover and is connected to the second lifting means, and a gap between the top cover and the rod is sealed by a sealing structure having the shape of an airtight, flexible, annular tube, and filled with a gas. Thus, the sealing of the gap between the top cover and the rod connected to the wafer holding means can be improved. The first lifting means is provided with a stopper for limiting the upward movement of the wafer holding means relative to the top cover to prevent the wafer holding means from moving beyond an upper limit and colliding against the top cover.

The wafer holding means comprises a pair of lower support members for supporting a plurality of wafers in a vertical position at suitable intervals, and a pair of upper support members disposed beside a region above the lower support members, each of the lower support members has a rigid core and a support block of a synthetic resin resistant to different kinds of cleaning liquids, each of the lower support members is provided with grooves of a substantially V-shaped cross section for supporting wafers therein, and each of the upper support members is provided with grooves of a substantially Y-shaped cross section for preventing wafers from tilting. Thus, the volume of the support members, i.e., the wafer holding means, can be reduced to the least possible extent. Accordingly, the cleaning tank need not be very large and has a predetermined cleaning liquid storing capacity, the cleaning and drying apparatus can be built in a small construction, and the wafers can be stably held.

A wafer processing system according to a second aspect of the present invention comprises one or a plurality of processing tanks to process a plurality of wafers arranged in parallel to each other in a vertical position therein, a carrying means disposed over the processing tanks and capable of horizontally moving over the processing tanks to carry wafers, and wafer holding means for holding wafers in each processing tank and moving wafers between a position in each processing tank and a transfer position above the same processing tank. The carrying means is provided with a first support member which supports wafers at lower sections of their peripheral portions, and tilt preventing members disposed, respectively, on the outer sides of the first support member so as to engage with side sections of peripheral portions of wafers to prevent wafers from tilting. The wafer holding means is provided with second support members which support wafers at lower sections of their peripheral portions. The first support member and the tilt preventing members, and the second support members are arranged so that the first support member and the tilt preventing members do not overlap the second support members as viewed in a plane to prevent the first support member and the tilt preventing members of the carrying means from interfering with the second support members when the second support members are moved vertically with the carrying means located above the processing tank. The tilt preventing members of the carrying means can be moved to a position where the tilt preventing members are not interfered with by the wafers and the second support members when the carrying means is moved horizontally with the second support members located at a transfer position above the processing tank.

According to the present invention, wafers are supported at lower sections of their peripheral portions by the first support member, the tilt preventing members are positioned beside the peripheral portions of the wafers to prevent the wafers from tilting, and the carrying means carries the plurality of parallel wafers in a vertical position to a transfer position above the processing tank when carrying the wafers to the processing tank. The second support members of the wafer holding means are raised after the carrying means has been moved to the transfer position above the processing tank to support the wafers at lower sections of their peripheral portions by the second support members, and the wafers are transferred from the first support member and the tilt preventing members to the second support members. Subsequently, the tilt preventing members are moved to a position where the tilt preventing members will not interfere with the wafers and the second support members, the carrying means is moved horizontally to retract the same away from the transfer position above the processing tank. Then, the second support members supporting the wafers transferred thereto are lowered into the processing tank. When taking out the wafers from the processing tank, the second support members of the wafer holding means holding the wafers are raised to a transfer position above the processing tank to move the wafers to a transfer position above the processing tank. Then, the carrying means is moved horizontally to a transfer position above the processing tank with the tilt preventing members moved to a position where the same will not touch the wafers and the second support members. Then, the second support members are lowered to transfer the wafers from the second support members to the first support member to make the first support member support the wafers at the lower sections of their peripheral portions. Then, the carrying means is moved horizontally with the tilt preventing members disposed beside the peripheral portions of the wafers.

In the carrying means, it is desirable that the tilt preventing members can be lowered to positions substantially corresponding to the level of the first support members so that the tilt preventing members may not interfere with the wafers and the second support members.

It is preferable to form grooves for receiving lower sections of the peripheral portions of the wafers in the upper surface of the first support member and to form grooves for receiving side sections of peripheral portions of the wafers in the inner surface of each of the tilt preventing members in order that the wafers can be stably supported during carrying. It is preferable to form grooves for receiving lower sections of the peripheral portions of the wafers in the upper surface of each of the second support members in order that the wafers can be stably held in the processing chamber.

It is desirable that spaces are formed between the first support member and the tilt preventing members, and the second support members of the wafer holding means are moved vertically through the spaces with the carrying means moved to a transfer position above the processing tank, which prevents the first support member and the tilt preventing members from interfering with the second support members. The first support member may comprise a plurality of support elements arranged so as to form spaces between the adjacent support elements to move the second support members vertically through the spaces with the carrying means moved to a transfer position above the processing chamber.

Preferably, the tilt preventing members of the carrying means separate from side sections of peripheral portions of the wafers as the same are lowered.

Wafers are supported at lower sections of their peripheral portions by the first support member, and the tilt preventing members are engaged with side sections of peripheral portions of the wafers to prevent the wafers from tilting. The carrying means carries the plurality of parallel wafers in a vertical position to a transfer position above the processing tank, and the second support members of the wafer holding means are raised with the carrying means positioned at the transfer position above the processing tank to support the wafers at lower sections of their peripheral portions by the second support members. The tilt preventing members of the carrying means are moved to positions where the tilt preventing members will not interfere with the wafers and the second support members, and the carrying means is moved horizontally away from the transfer position above the processing tank. The second support members of the wafer holding means are lowered to place the wafers in the processing tank, and the second support members of the wafer holding means are raised after the wafers have been processed to place the wafers at a transfer position above the processing tank. The carrying means is moved horizontally to a transfer position above the processing tank with the tilt preventing members held at positions where the tilt preventing members will not interfere with the wafers and the second support members, then, the second support members of the wafer holding means are lowered to transfer the wafers from the second support members to the first support member so that the wafers are supported at lower sections of their peripheral portions by the first support member. The tilt preventing members are engaged with side sections of peripheral portions of the wafers, and then the carrying means is moved horizontally to carry the wafers away from the transfer position above the processing tank.

After the wafers have been processed, the tilt preventing members are moved to positions where the tilt preventing members are able to prevent the wafers from tilting before the second support members of the wafer holding means are lowered to support the processed wafers at lower sections of their peripheral portions by the first support member.

BRIEF DESCRIPTION OF THE DRAWINGS

FIG. 9(a) is a sectional front view of a lower support member included in the wafer holding means of FIG. 8(a);

FIG. 9(b) is a sectional side view of the lower support member of FIG. 9(a);

FIG. 10(a) is an enlarged sectional view showing support grooves formed in the lower support member of FIG. 9(a);

FIG. 10(b) is an enlarge sectional view showing tilt preventing grooves formed in an upper support member in accordance with the present invention;

FIG. 25 is a schematic plan view showing the positional relation between a first support member and tilt preventing members, and a second support member in a state where the carrying device is positioned above a processing tank;

FIG. 26 is a diagrammatic view illustrating a state where wafers are being carried to a transfer position above the processing tank;

FIG. 27 is a diagrammatic view illustrating a state where the wafers are positioned above the processing tank;

FIG. 28 is a diagrammatic view of assistance in explaining a process of transferring the wafers from the carrying device to the wafer holding means;

FIG. 29 is a diagrammatic view of assistance in explaining a process of transferring wafers from the carrying device to the wafer holding means;

FIG. 30 is a diagrammatic view of assistance in explaining a process of transferring the wafers from the carrying device to the wafer holding means;

FIG. 31 is a diagrammatic view illustrating a state where the wafers are placed in the processing tank;

FIG. 32 is a diagrammatic view illustrating a state where the wafers are raised to a transfer position above the processing tank;

FIG. 33 is a diagrammatic view illustrating a process of transferring the wafers from the wafer holding means to the carrying device;

FIG. 34 is a diagrammatic view illustrating a process of transferring wafers from the wafer holding means to the carrying device;

FIG. 35 is a diagrammatic view illustrating a process of transferring the wafers from the holding means to the carrying device;

DESCRIPTION OF THE PREFERRED EMBODIMENTS

First Embodiment

A cleaning and drying apparatus in a first embodiment according to the present invention will be described as applied to a semiconductor wafer cleaning system with reference to FIGS. 1 to 20.

Figure 1:
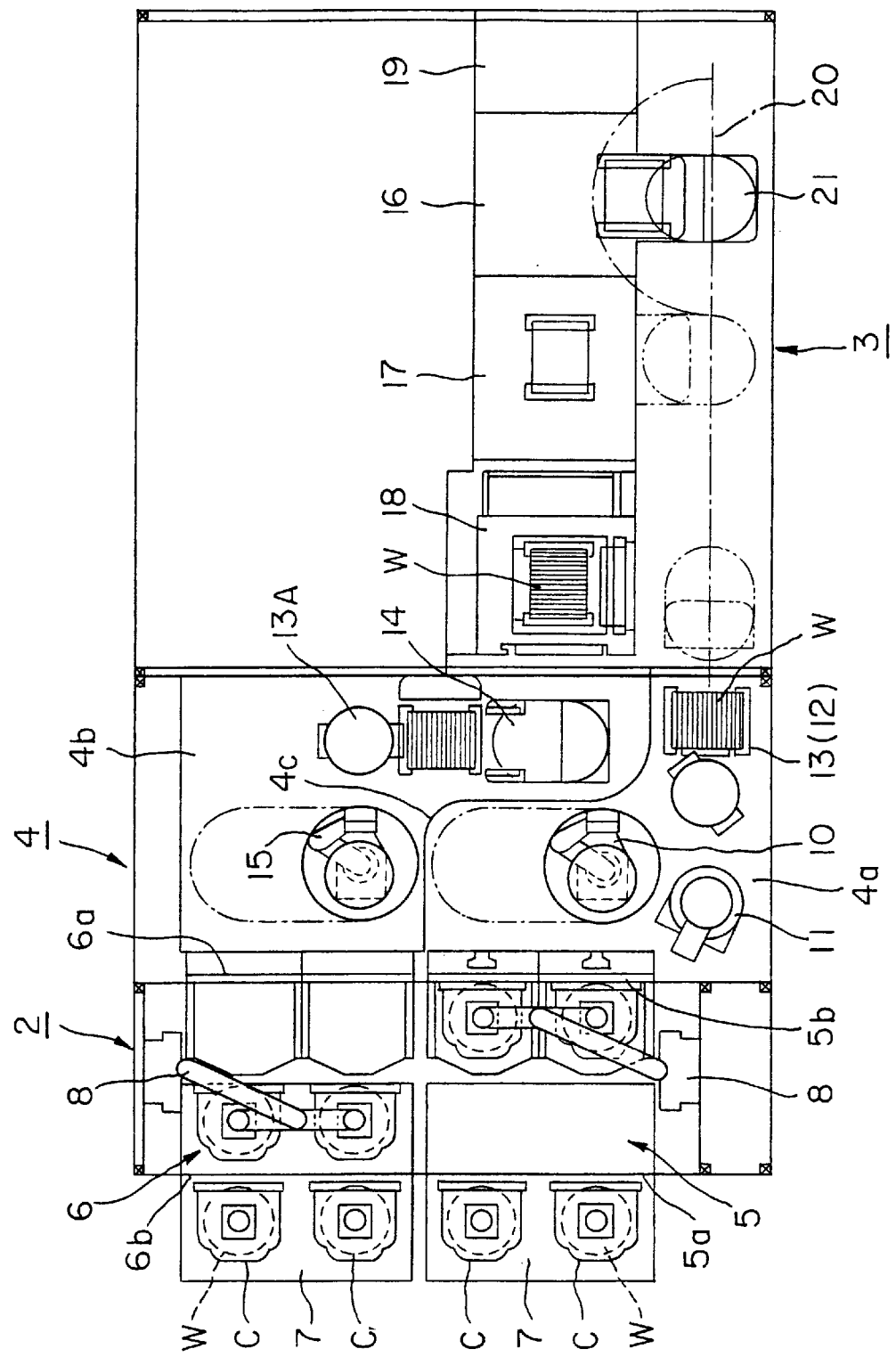
FIG. 1 is a schematic plan view of a cleaning system employing a cleaning and drying apparatus in a first embodiment according to the present invention.
Figure 2:
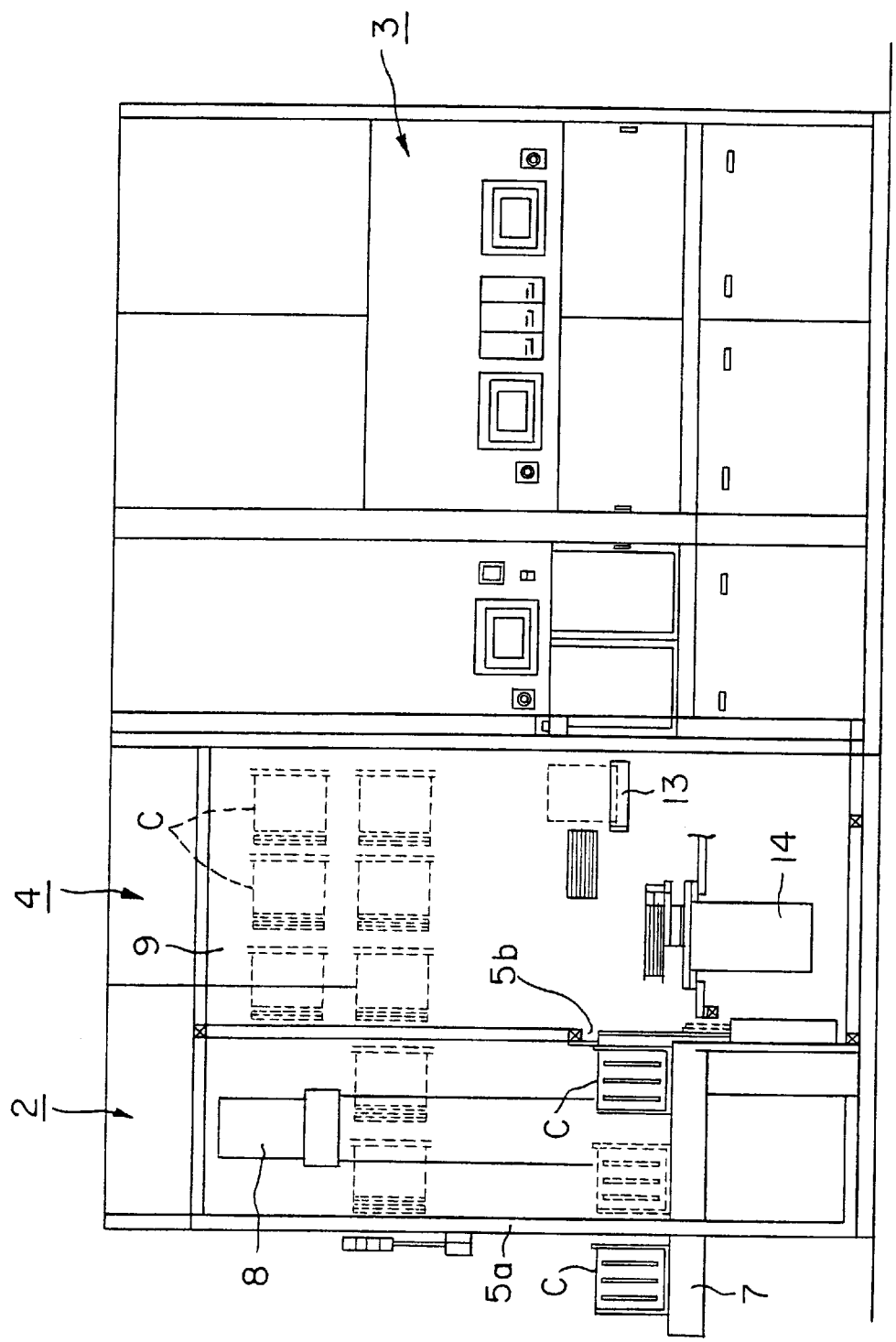
FIG. 2 is a schematic side view of the cleaning system of FIG. 1.

FIG. 1 is a schematic plan view showing, by way of example, a cleaning system employing a cleaning and drying apparatus 18 in a first embodiment according to the present invention, and FIG. 2 is a schematic side view of the cleaning system of FIG. 1.

The cleaning system has, as principal components, a carrying unit 2 which carries a carrying case C containing semiconductor wafers (object) W (hereinafter referred to simply as "wafer") in a horizontal position, a cleaning unit 3 which processes wafers W for cleaning with cleaning liquids, such as liquid chemicals, and drying the cleaned wafers W, and an interfacing unit 4 interposed between the carrying unit 2 and the cleaning unit 3 to carry out the transfer of the wafers W, the positional adjustment of the wafers W and the conversion of the position of the wafers W.

The carrying unit 2 has a receiving station 5 and a delivery station 6, which are disposed side by side on one side of the cleaning system. Slide tables 7 for loading the carrying case C into the receiving station 5 and unloading the same from the delivery station 6 are placed at an entrance 5a of the receiving station 5 and at an exit 6b of the delivery station 6. Case lifting devices 8 (case carrying means) are disposed in the receiving station 5 and the delivery station 6. Carrying cases C are carried in the receiving station 5 and the delivery station 6 by the case lifting devices B. As shown in FIG. 2, empty carrying cases C are delivered to a case storage unit 9 disposed above the carrying unit 2 and is received from the carrying case storage unit 9 by the case lifting device 8.

The inner space of the interfacing unit 4 is divided by a partition wall 4c into a first chamber 4a contiguous with the receiving station 5, and a second chamber 4b contiguous with the delivery station 6. Disposed in the first chamber 4a are a wafer handling arm 10 (wafer handling means) capable of taking out a plurality of wafers W from a carrying case C, of carrying the wafers W in horizontal directions, (X- and Y-directions) and vertical directions (Z-direction) and of turning the wafers W in a (-direction, a notch aligner 11 (position finding means) for detecting notches formed in the wafers W, an interval adjusting device 12 for adjusting intervals between the plurality of wafers W taken out from a carrying case C, and a first position converting device 13 (position converting means) for setting the wafers W placed in a horizontal position in a vertical position.

Disposed in the second chamber 4b are a wafer transfer arm 14 (wafer carrying means) for receiving a plurality of processed wafers W in a vertical position from the cleaning unit 3 and carrying the processed wafers W, a second position converting device 13A (position converting device) for setting the wafers W placed in a vertical position and received from the wafer transfer arm 14 in a horizontal position, and a wafer storing arm 15 (wafer storing means) L for receiving the plurality of wafers W set in a horizontal position by the second position changing device 13A and putting the wafers W in an empty carrying case C, capable of moving the wafers W in horizontal directions (X- and Y-direction) and vertical directions (Z-direction) and of turning the wafers W in a (-direction. The second chamber 4b is sealed and air in the second chamber 4b is replaced with an inert gas, such as nitrogen gas ($N_2$ gas) supplied by an inert gas supply unit, not shown.

The cleaning unit 3 includes a first processing unit 16 for removing particles and organic contaminants from the wafers W, a second processing unit 17 for removing metallic contaminants from the wafers W, the cleaning and drying unit 18 of the present invention, and a chuck cleaning unit 19, which are arranged in a row. A wafer carrying arm 21 (carrying means) is disposed for movement along a carrying path extending along the units 16 to 19. The wafer carrying arm 21 is capable of moving in horizontal directions (X- and Y-directions) and vertical directions (Z-direction) and of turning in a (-direction. The wafer carrying arm 21 may be substituted by a carrying device 110 employed in a second embodiment of the present invention which will be described later.

Figure 3:
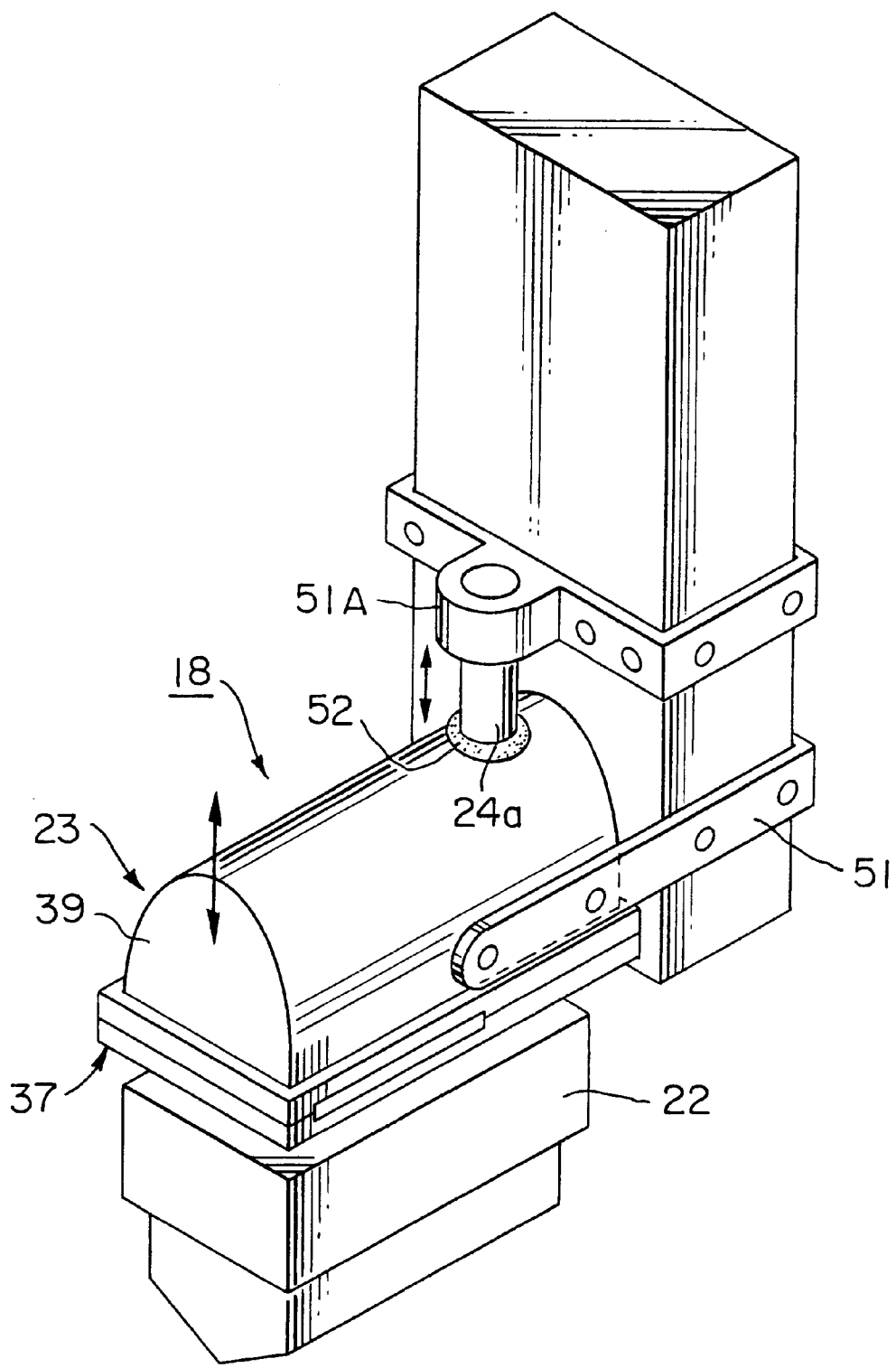
FIG. 3 is a schematic perspective view of the cleaning and drying apparatus in the first embodiment.
Figure 4:
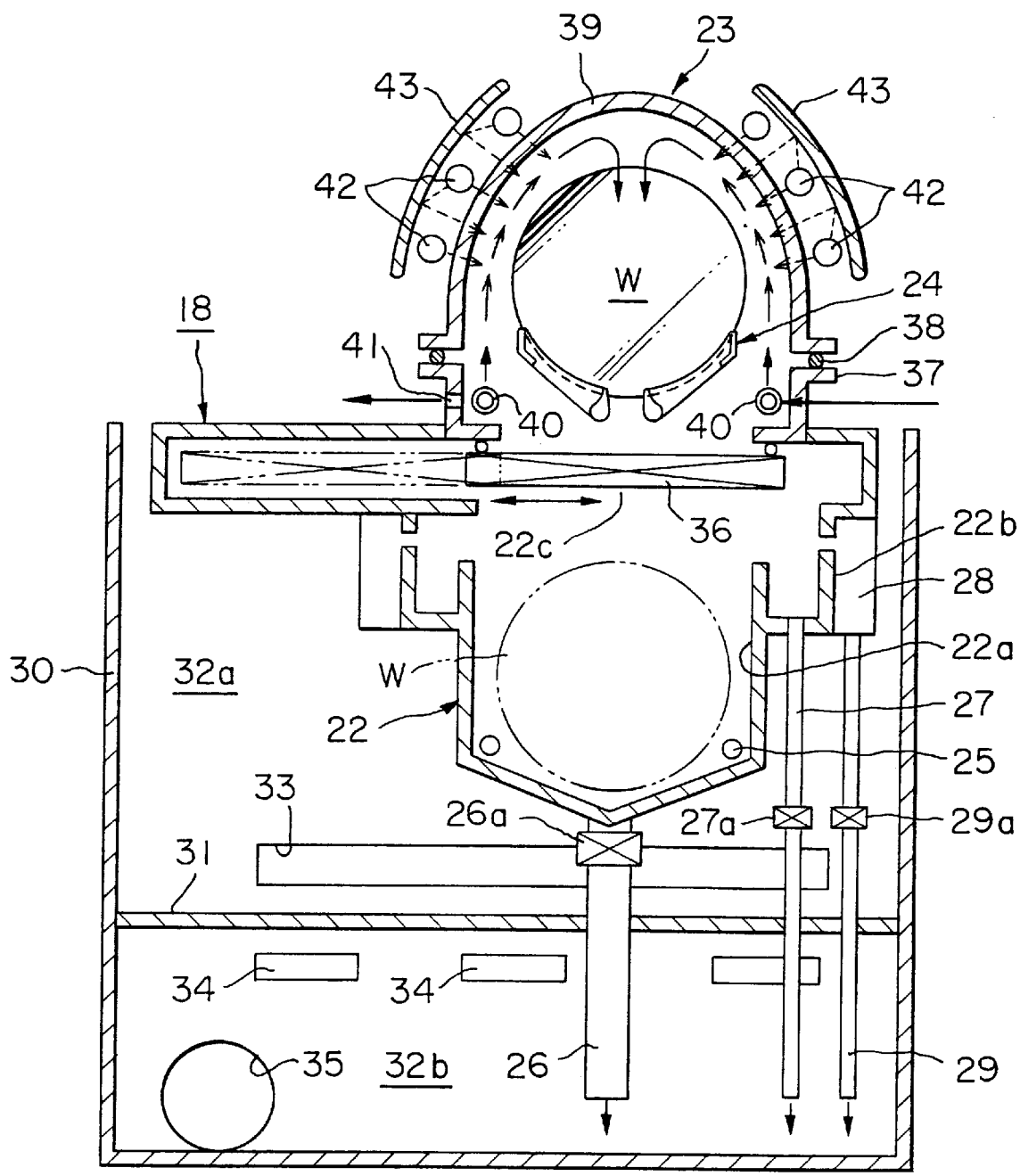
FIG. 4 is a sectional view of the cleaning and drying apparatus of FIG. 3.
Figure 5:
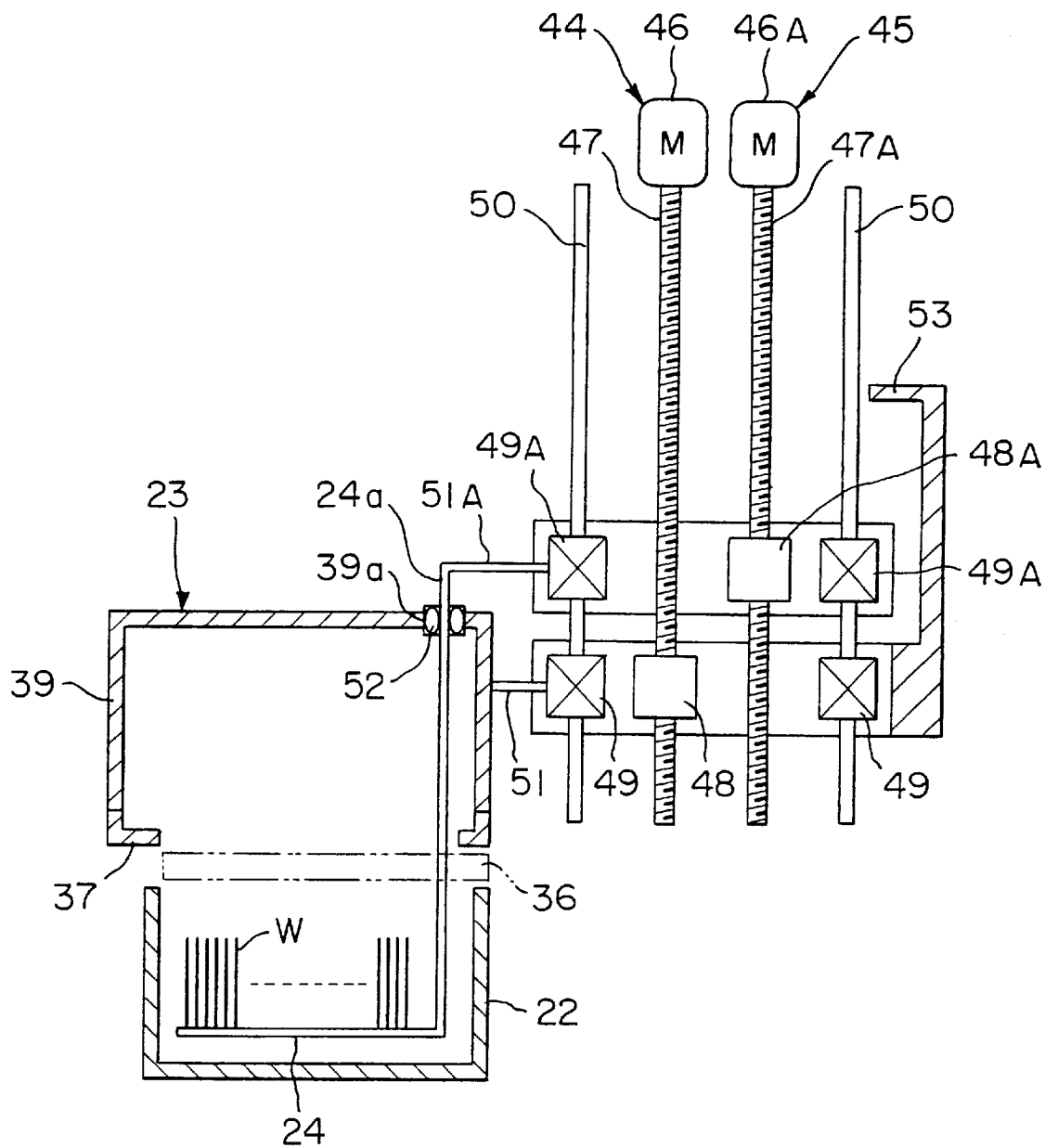
FIG. 5 is a schematic sectional view of a lifting mechanism of a top cover and a lifting mechanism of wafer holding means in accordance with the present invention.

Referring to FIGS. 3 to 5, the cleaning and drying unit 18 comprises, as principal components, a cleaning tank 22 containing a cleaning liquid (a liquid chemical, such as hydrofluoric acid, or pure water), a drying vessel 23 disposed above the cleaning tank 22, and a wafer boat 24 (object holding means) which supports the plurality of wafers W, such as fifty wafers W, and carries the wafers W into the cleaning tank 22 and the drying vessel 23. The wafers W are immersed in the cleaning liquid in the cleaning tank 22.

The cleaning tank 22 has an inner tank 22a made of quartz or polypropylene, and an outer tank 22b surrounding an upper portion of the inner tank 22a to receive the cleaning liquid overblown by the inner tank 22a. Cleaning liquid spraying nozzles 25 for spraying the wafers W placed in the cleaning tank 22 with the cleaning liquid are arranged near the opposite side walls of the inner tank 22a. A liquid chemical supply source, not shown, and a pure water supply source, not shown, are connected through a selector valve, not shown, to the cleaning liquid spraying nozzles 25. The selector valve is controlled to supply a liquid chemical or pure water through the cleaning liquid spraying nozzles 25 into the cleaning tank 22. The inner tank 22a is provided in its bottom wall with a drain port, and a drain pipe 26 is connected through a drain valve 27a to the drain port. An exhaust box 28 is disposed so as to surround the outer tank 22b, and an exhaust pipe 29 is connected through an exhaust valve 29a to the exhaust box 28.

The cleaning tank 22 and the exhaust box 28 thus formed are disposed in a bottomed box 30. The interior of the box 30 are divided by a horizontal partition plate 31 into an upper chamber 32a containing the cleaning tank 22, and a lower chamber 32b containing the drain pipes 26 and 27 connected, respectively, to the inner tank 22a and the outer tank 22b, and the exhaust pipe 29. The partition plate 31 prevents the atmosphere of the lower chamber 32b and the spray of the drain from entering the upper chamber 32a to keep the upper chamber 32a clean. An exhaust window 33 is formed in a side wall defining the upper chamber 32a, exhaust windows 34 are formed in an upper portion of a side wall defining the lower chamber 32b, and a drain opening 35 is formed in a lower portion of the side wall.

The drying vessel 23 has a fixed base 37 having an opening communicating with the opening 22c of the cleaning tank 22, a shutter 36 disposed between the opening of the fixed base 37 and the opening 22c of the cleaning tank 22, a top cover 39 (liftable top cover) capable of being closely joined to the fixed base 37, and an O-ring 38, i.e., a sealing member, interposed between the fixed base 37 and the top cover 39. The fixed base 37 may be omitted and the top cover 39 may be put directly on the cleaning tank 22. The fixed member 37 may be formed in a great height and the top cover 39 may be formed in a small height. The top cover 39 is made of quarts and has a cross section of a shape resembling the inverted letter U. The fixed base 37 is made of quartz. Therefore, the condition of wafers W placed in the drying vessel 23 can be visually recognized. A drying gas supply device 40 is disposed in the fixed base 37 of the drying vessel 23 to jet a drying gas, i.e., vapor of a solvent, such as isopropyl alcohol, upward, and a drying gas discharge opening 41 is formed in the side wall of the fixed base 37. An isopropyl alcohol gas generator, not shown, and a drying gas carrying gas heating device, not shown, for heating a gas for the force-feed of the drying gas, such as $N_2$ gas, are connected to the drying gas supply device 40. A discharge device, not shown, is connected to the discharge opening 41. The drying gas supply device 40 and the discharge opening 41 are disposed so that the drying gas 41 flows upward along the inner surfaces of the side walls of the top cover 39, flows downward through the central region of the space defined by the top cover 39 and is discharged through the discharge opening 41 as indicated by the arrows in FIG. 4. Consequently, the drying gas enveloping wafers W placed in the drying vessel 23 uniformly, condenses over the surfaces of the wafers W to dry the wafers W uniformly by the replacing effect of the condensed drying gas.

Heating lamps 42 (heating elements) are disposed outside the opposite side walls of the top cover 39, and reflecting plates 43 are disposed behind the heating lamps 42. The interior of the drying vessel 23 is irradiated directly with heat rays emitted by the heating lamps 42 and heat rays emitted by the heating lamps 42 and reflected by the reflecting plates 43 to heat the interior of the drying vessel 23, so that the drying of the wafers W placed in the drying vessel 23 is promoted.

Figure 6:
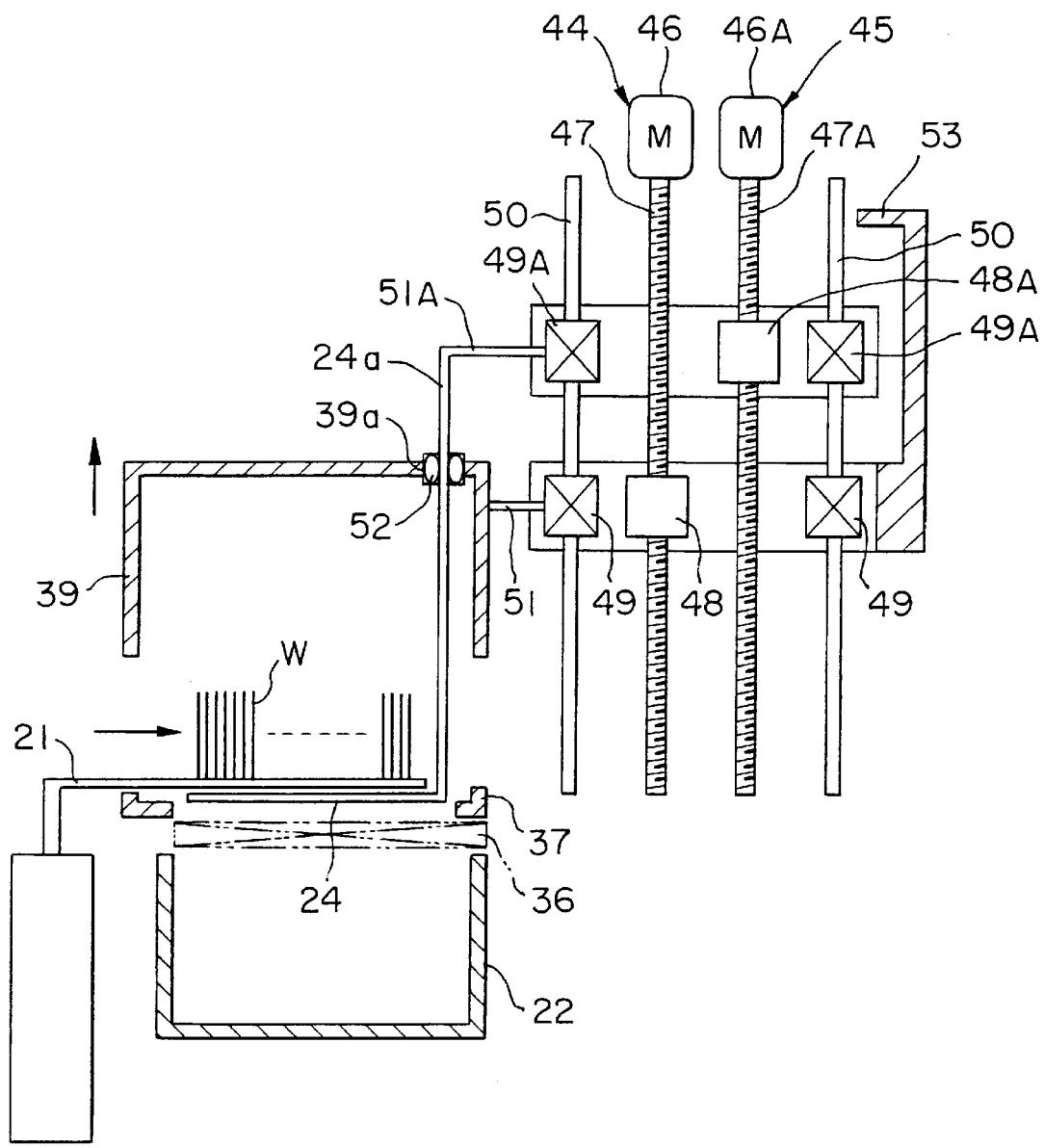
FIG. 6 is a schematic sectional view, similar to FIG. 5, of assistance in explaining the operation of the lifting mechanism of the top cover and the lifting mechanism of the wafer holding means.

The top cover 39 can be brought into close contact with the fixed base 37 and lifted up away from the fixed base 37 by a first lifting mechanism 44. As shown in FIGS. 5 and 6, the first lifting mechanism 44 is a ball screw mechanism comprising a screw shaft 47 driven for rotation by a motor 46, a threaded block 48 linked to the screw shaft 47 by balls, and a first connecting member fixed to the threaded block 48. Two slide blocks 49 guided for sliding motion by two guide rails 50 parallel to the screw shaft 47 are fixed to the first connecting member fixed to the threaded block 48. The first lifting mechanism 44 is connected to the top cover 39 by a bracket 51 to move the top cover 39 vertically.

A second lifting mechanism 45 moves the wafer boat 24 vertically in the cleaning tank 22 and the drying vessel 23. The second lifting mechanism 45 comprises a screw shaft 47A extended in parallel to the screw shaft 47 of the first lifting mechanism 44 and driven for rotation by a motor 46A, a threaded block 48A linked to the screw shaft 47A by balls, and a second connecting member fixed to the threaded block 48A. Two slide blocks 49A guided for sliding motion by the two guide rails 50 are fixed to the second connecting member fixed to the threaded block 48A. The second lifting mechanism 45 is connected to a rod 24a attached to the wafer boat 24 by a bracket 51A to move the wafer boat 24 vertically.

The first lifting mechanism 44 lifts up the top cover 39 to form a wafer handling space above the opening 22c of the cleaning tank 22. Wafers W are carried sideways into the wafer handling space by the wafer carrying arm 21, and then the wafer boat 24 is raised by the second lifting mechanism 45 to transfer the wafers W from the wafer carrying arm 21 to the wafer boat 24 (FIG. 6). When transferring the wafers W from the wafer carrying arm 21 to the wafer boat 24, the wafer carrying arm 21 is positioned on one side of the space between the fixed base 37 and the top cover 39, i.e., on one side of a space under the top cover 39.

Ball screw mechanisms are employed as the first lifting mechanism 44 and the second lifting mechanism 45, and the slide blocks 49 and 49A share the common guide rails 50. Therefore, a driving mechanism is simplified, and the top cover 39 and the wafer boat 24 can be vertically moved with high accuracy.

Figure 7A:
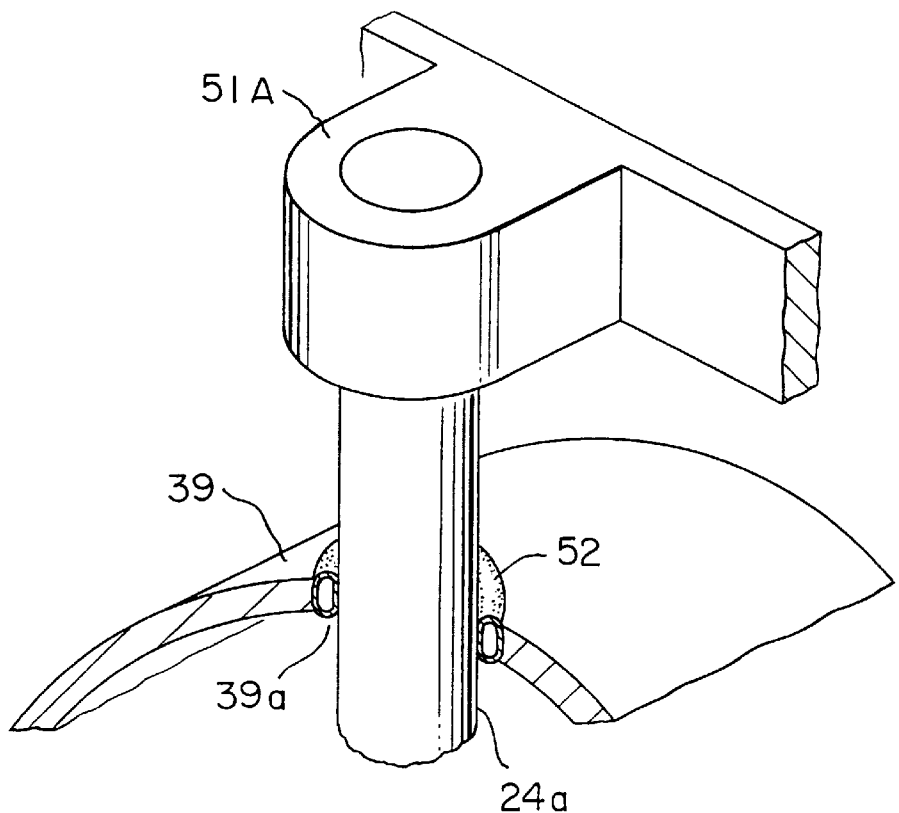
FIG. 7(a) is a sectional perspective view of a sealing structure in accordance with the present invention.
Figure 7B:
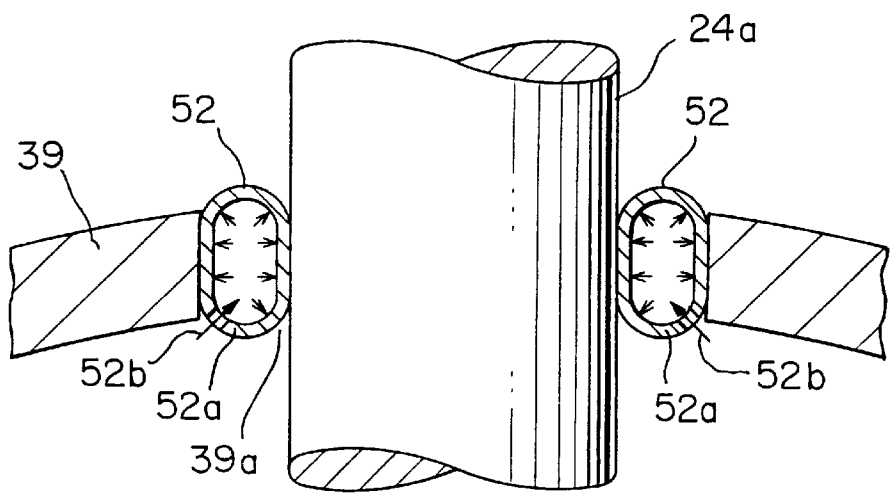
FIG. 7(b) is an enlarged sectional view of an essential portion of the sealing structure of FIG. 7(a)
Figure 8:
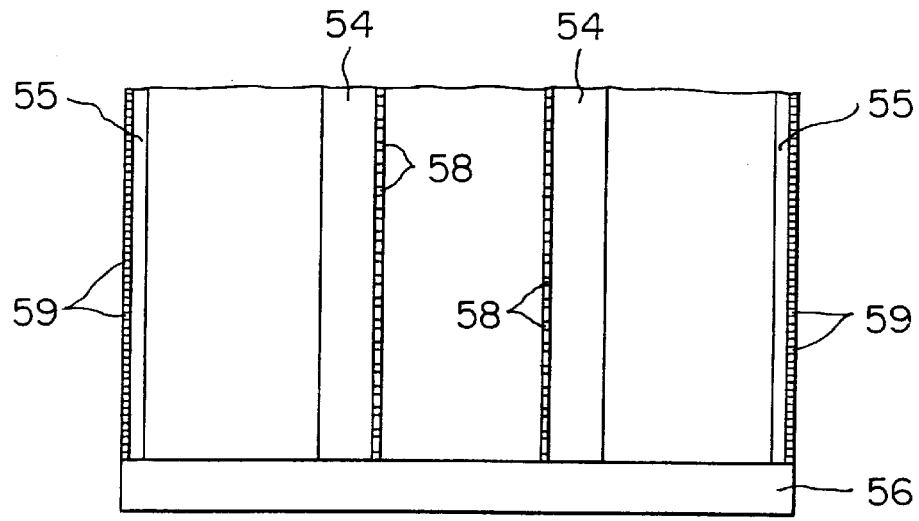
FIG. 8(a) is a fragmentary plan view of an essential portion of the wafer holding means in accordance with the present invention.
FIG. 8(b) is a front view of the wafer holding means of FIG. 8(a)
Figure 8:
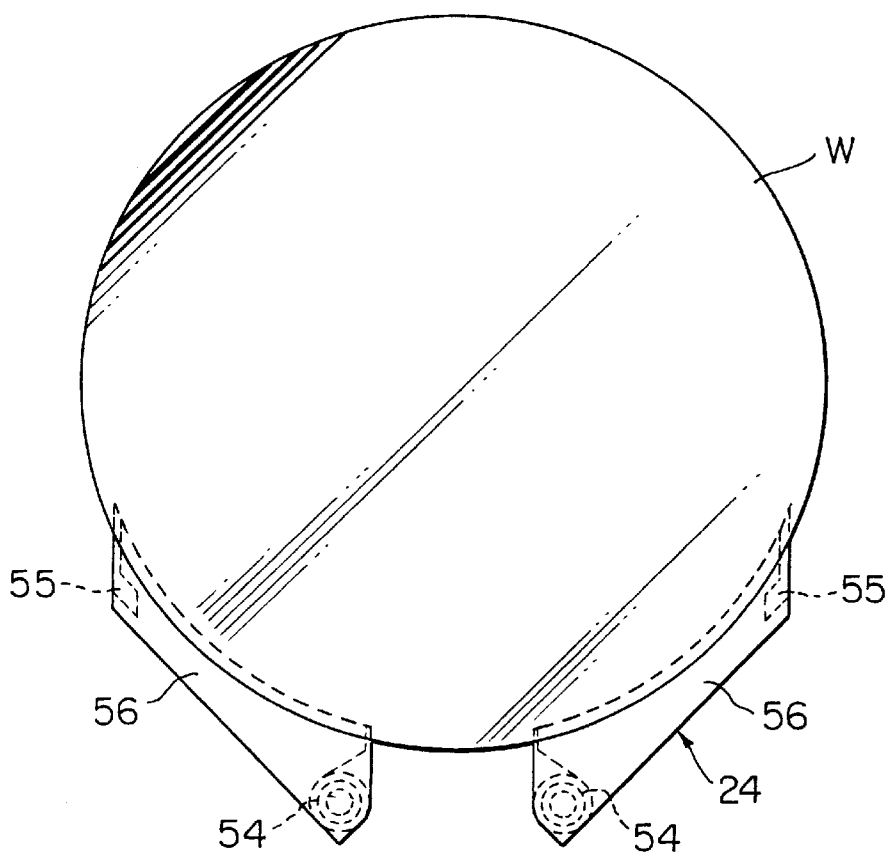

The top cover 39 is provided with a through hole 39a in a portion on one side of the top thereof, the rod 24a attached to the wafer boat 24 is extended slidably through the through hole 39a, and a gap between the periphery of the through hole 39a and the rod 24a is sealed hermetically with a sealing structure 52. As shown in FIGS. 7(a) and 7(b), the sealing structure 52 is formed by sealing a gas 52b, such as air, in an airtight, flexible, annular tube 52a. The annular tube 52a is expanded by the gas 52b sealed therein so that the gap between the periphery of the through hole 39a and the rod 24a can be sealed.

As shown in FIGS. 5 and 6, the first connecting member connecting the threaded block 48 and the slide blocks 49 of the first lifting mechanism 44 is provided with a stopper 53 for limiting the upward movement of the second connecting member connecting the threaded block 48A and the slide blocks 49A of the second lifting mechanism 45 relative to the first connecting member. Since the upward movement of the threaded block 48A of the second lifting mechanism relative to the threaded block 48 of the first lifting mechanism 44 is limited by the stopper 53, the accidental collision of the wafer boat 24 against the top cover 39 can be avoided.

As shown in FIGS. 8(a) and 8(b), the wafer boat 24 comprises a pair of lower support members to support the plurality of wafers W, for example, fifty wafers W, thereon in a vertical position, and a pair of upper support members 55 extended obliquely upward away from each other from the lower support members 54. The lower support members 54 and the upper support members 55 are extended between a support plate, not shown, connected to the rod 24a, and connecting plates 56. As shown in FIGS. 9(a) and 9(b), each of the lower support members 54 has a rigid core pipe 57a of, for example, a stainless steel pipe, and a support block 57b made of a synthetic resin, such as polyether ether ketone (PEEK), resistant to different kinds of cleaning liquids, such as a liquid chemical and pure water, having a wafer supporting surface provided with support grooves 58 of a substantially V-shaped cross section and arranged at suitable intervals as shown in FIGS. 9(b) and 10(a), and put on the core pipe 57a so as to cover the core pipe 57a entirely. Each of the upper support members 55 is made of a synthetic resin, such as PEEK, and is provided in its upper surface with a substantially Y-shaped tilt preventing grooves 59 each consisting of a wide V-shaped section 59a and a narrow V-shaped section 59b, and arranged at suitable intervals.

Each lower support member 54 formed by assembling the rigid core pipe 57a of a stainless steel, and the support block 57b of PEEK has sufficient strength and the volume of the lower support member 54 can be reduced to the least possible extent, and hence the volume of the cleaning liquid stored in the cleaning tank 22 can be increased accordingly. Consequently, the cleaning tank 22 can be formed in a small volume. The wafers W of a great diameter, such as 12 in., can be stably supported by supporting the wafers W in the support grooves 58 formed in the lower support members 54 and fitting lower sections of the peripheral portion of each wafer W slightly below the level of the center of the wafer W in the tilt preventing grooves 59 of the upper support members 55.

The operation of the cleaning and drying unit 18 of the present invention will be described with reference to FIGS. 11 to 20. The operation of the cleaning and drying unit 18 is controlled by a controller, not shown.

Figure 11:
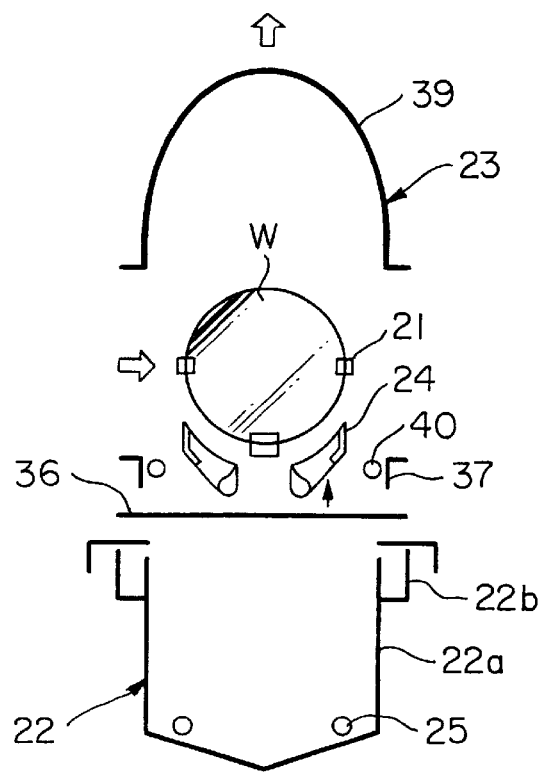
FIG. 11 is a schematic sectional view showing a state before wafer transfer.
Figure 12:
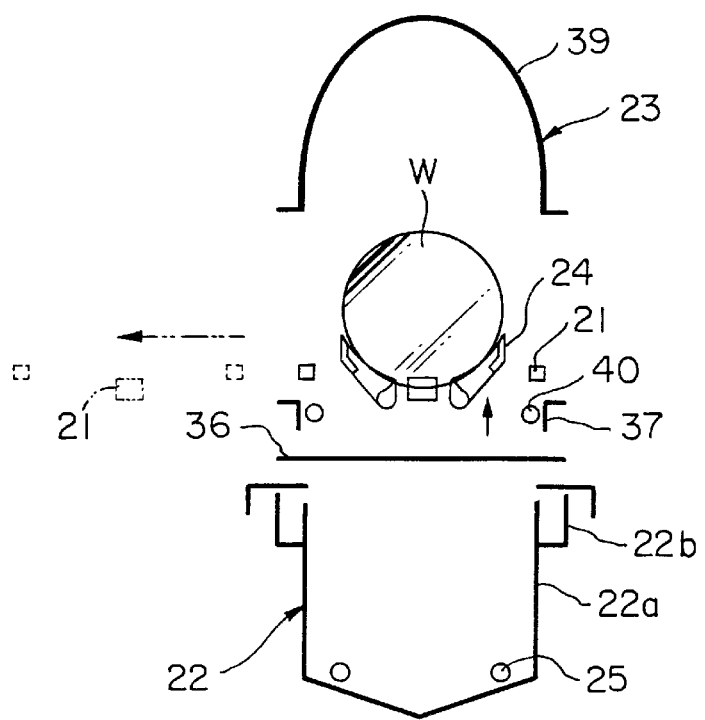
FIG. 12 is a schematic sectional view showing a state during wafer transfer.
Figure 13:
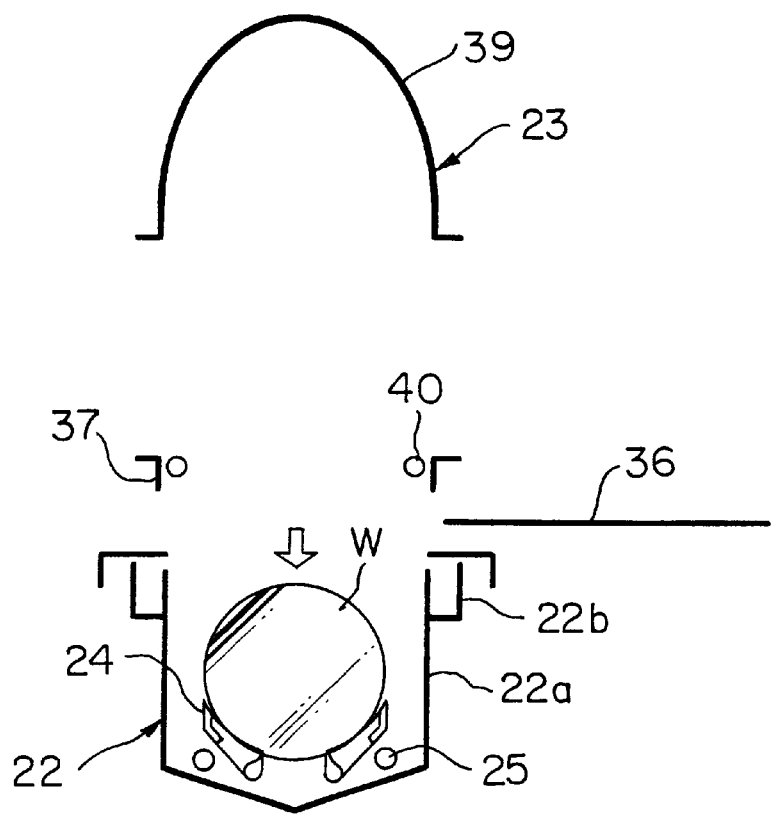
FIG. 13 is a schematic sectional view showing a state where wafers are placed in a cleaning tank.

The shutter 36 for closing the opening 22c of the cleaning tank 22 is closed, the first lifting mechanism 44 is driven to raise the top cover 39 so that a space is formed over the cleaning tank 22. The wafer carrying arm 21 holding the wafers W moves sideways to carry the wafers W into the space as shown in FIG. 11. Then, the second lifting mechanism 45 is driven to raise the wafer boat 24, and the wafers W are transferred from the wafer carrying arm 21 to the wafer boat 24 as shown in FIG. 12. The shutter 36 is opened after the wafer carrying arm 21 has been retracted, and the second lifting mechanism 45 is driven to lower the wafer boat 24 holding the wafers W into the cleaning tank 22 as shown in FIG. 13. The first lifting mechanism 44 is driven to lower the top cover 39 so that the top cover 39 is joined closely to the fixed base 37. The shutter 36 may be opened at the start.

Figure 14:
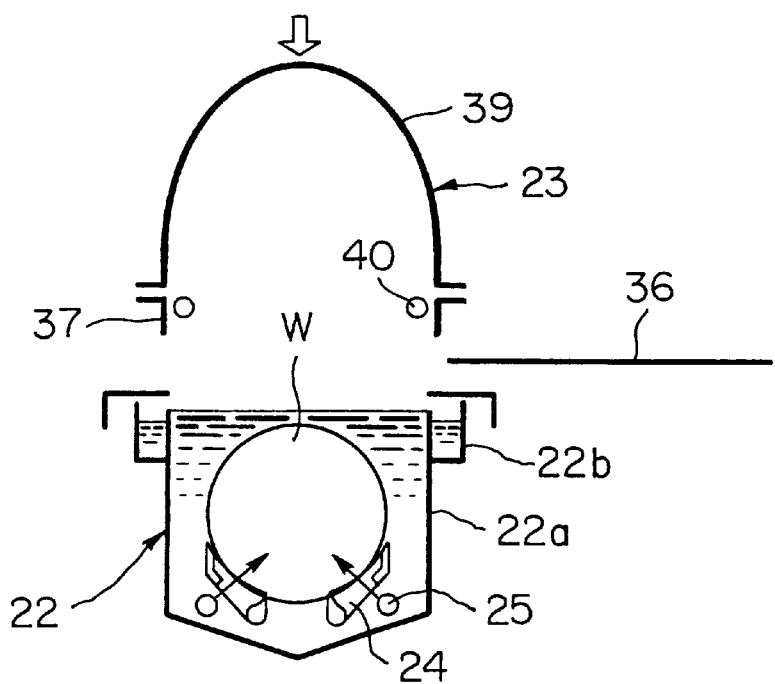
FIG. 14 is a schematic sectional view showing a state during a wafer cleaning process.
Figure 15:
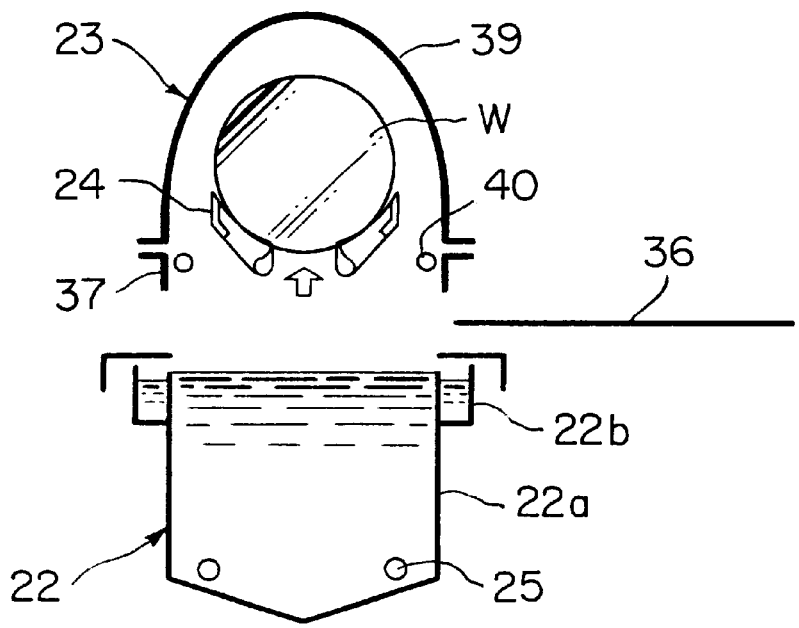
FIG. 15 is a schematic sectional view showing a state where the wafers are carried into a drying chamber.

A liquid chemical, such as hydrofluoric acid, is sprayed by the cleaning liquid spraying nozzles 25 to clean the wafers W. The liquid chemical may be stored beforehand in the processing tank 22. Subsequently, pure water is supplied through the cleaning liquid spraying nozzles 25 into the cleaning tank 22 for rinsing to replace the liquid chemical wetting the surfaces of the wafers W with pure water (FIG. 14). After the wafers W have been cleaned, the second lifting mechanism 45 is driven to raise the wafer boat 24 into the drying chamber of the drying vessel 23 as shown in FIG. 15, and then the shutter 36 is closed to separate the drying vessel 23 from the cleaning tank 22 and to isolate the drying chamber from the atmosphere. The shutter 36 may be kept closed during the processing of the wafers W in the cleaning tank 22.

Figure 16:
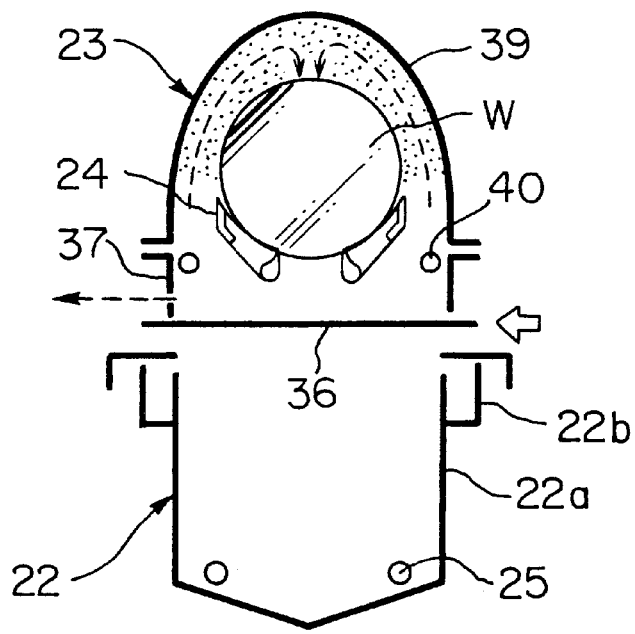
FIG. 16 is a schematic sectional view showing a state during a wafer drying process.

Subsequently, a drying gas, such as a mixed gas of isopropyl alcohol gas and $N_2$ gas, is supplied into the drying vessel 23 by the drying gas supply device 40 to create an isopropyl alcohol atmosphere in the drying chamber of the drying vessel 23. As shown in FIG. 16, the drying gas envelops the wafers W for drying them. During this drying operation, part of the drying gas is discharged through the discharge opening 41.

Figure 17:
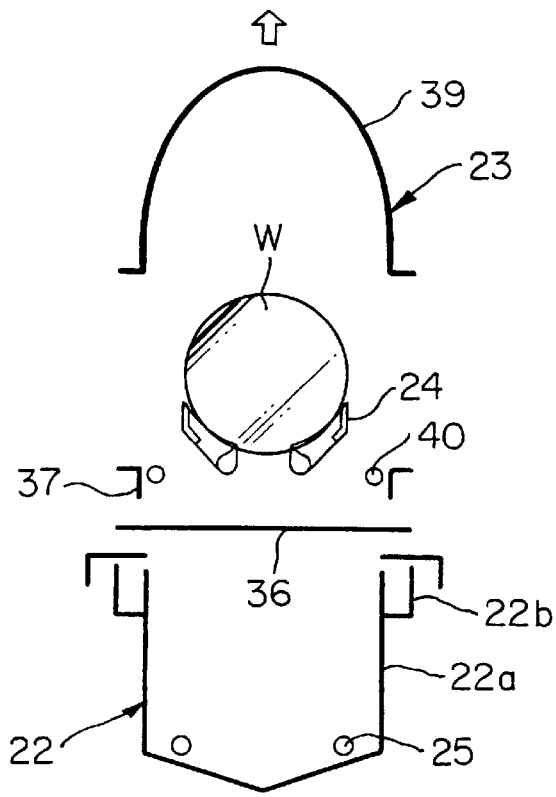
FIG. 17 is a schematic sectional view showing a state after the completion of the wafer drying process.
Figure 18:
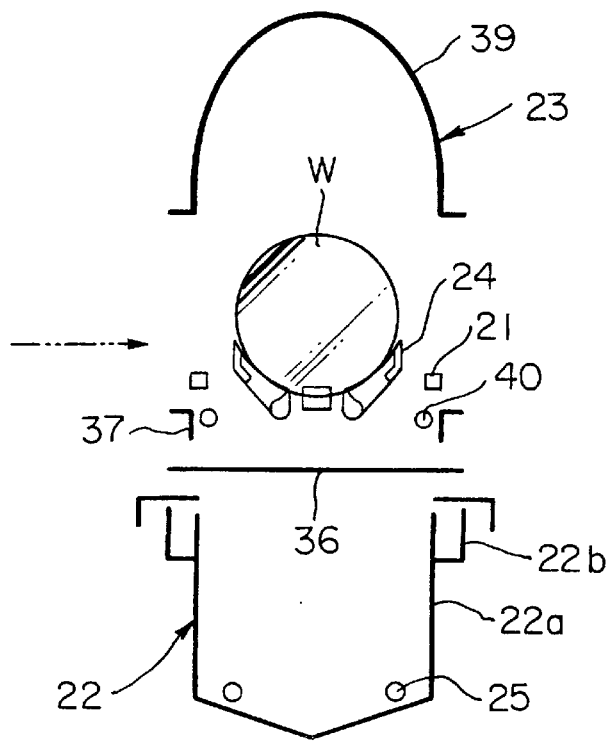
FIG. 18 is a schematic sectional view showing a state before the transfer of dried wafers.
Figure 19:
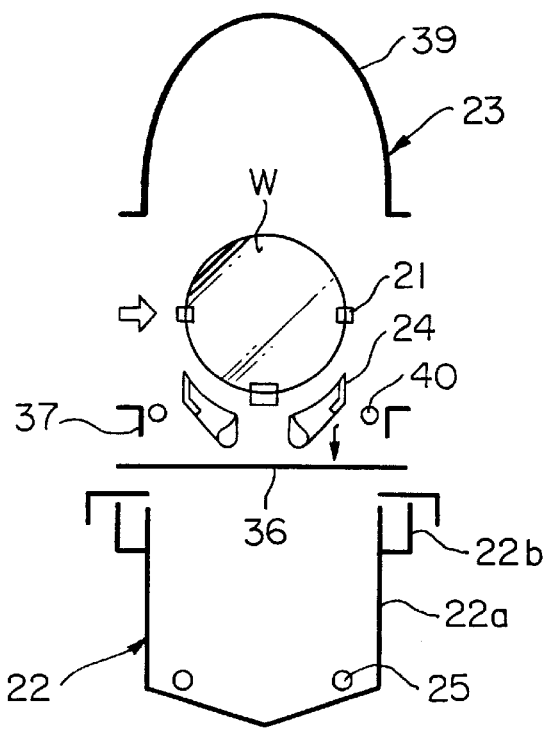
FIG. 19 is a schematic sectional view showing a state during the transfer of dried wafers.
Figure 20:
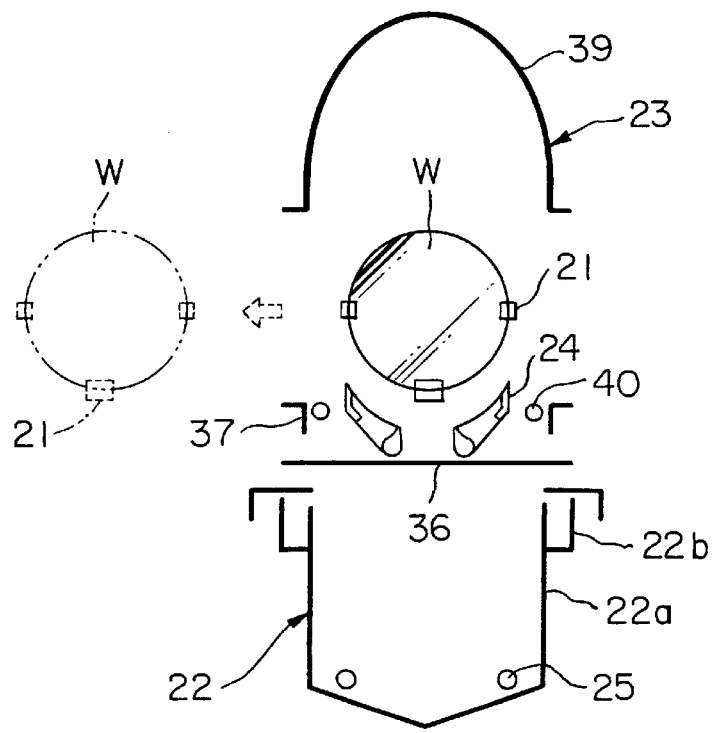
FIG. 20 is a schematic sectional view showing a state where the wafers are being carried away.

After water wetting the wafers W has been replaced with isopropyl alcohol or after the drying process has been completed and isopropyl alcohol has been purged from the drying chamber of the drying vessel 23 by supplying $N_2$ gas by the drying gas supply device 40 into the drying vessel 23, the first lifting mechanism 44 is driven to raise the top cover 39 so that a space is formed between the top cover 39 and the cleaning tank 22 as shown in FIG. 17. Then, the wafer carrying arm 21 is moved sideways to a position below the wafer boat 24 (FIG. 18), and the second lifting mechanism 45 is driven to lower the wafer boat 24, so that the wafers W are transferred from the wafer boat 24 to the wafer carrying arm 21 as shown in FIG. 19. Then, the wafer carrying arm 21 is moved away from the transfer position above the cleaning tank 22 to carry the wafers W to the next process (FIG. 20).

The wafer carrying arm 21 can be moved sideways into the space formed over the cleaning tank 22 by raising the top cover 39 to transfer the wafers W from the wafer carrying arm 21 to the wafer boat 24, and from the latter to the former. Therefore, the cleaning and drying unit 18 can be formed in a height smaller than that of a corresponding conventional cleaning and drying apparatus of the same type in which wafers W are moved from above a drying chamber into the drying chamber and moved upward out of the drying chamber, and hence the cleaning and drying unit 18 can be formed in a relatively small size. Since the wafer carrying arm 21 needs to move a relatively short distance, time necessary for the wafer carrying arm 21 to move for carrying wafers can be reduced and thereby the throughput of the cleaning and drying unit 18 can be enhanced.

Although the cleaning and drying apparatus in the first embodiment has been described as applied to the cleaning and drying unit of a semiconductor wafer cleaning system, naturally, the cleaning and drying apparatus is applicable to processing systems other than the semiconductor wafer cleaning system and applicable to cleaning plates other than semiconductor wafers, such as glass substrates for LCDs.

As is apparent from the foregoing description, the cleaning and drying apparatus of the present invention exercises the following excellent effects.

1) The drying chamber is defined by the fixed base fixed to the cleaning tank so as to communicate with the opening of the cleaning tank, and the top cover closely connected to the fixed base, and the top cover can be vertically moved to provide a space through which the wafer is inserted in the cleaning tank by lifting the top cover. Therefore, wafers can be transferred from the wafer carrying means which moves laterally into the space to the wafer holding means, and from the latter to the former. Accordingly, the cleaning and drying apparatus can be formed in a small construction and throughput can be improved.

2) The volume of the drying chamber can be reduced to the least necessary extent because the top cover is formed of quartz in a shape of a cross section resembling the inverted letter U. Consequently, the cleaning and drying apparatus can be built in a further reduced size, the precipitation and dissolution of metallic impurities will not occur, the production of particles can be suppressed and the yield can be improved. If the fixed base and the cleaning tank, in addition to the top cover, are formed of quartz, the production of particles can be further effectively suppressed and the yield can be improved.

3) Heating lamps (heating elements) are disposed outside the opposite side walls of the top cover, and reflecting plates are disposed behind the heating lamps. The interior of the drying vessel is irradiated directly with heat rays emitted by the heating lamps and heat rays emitted by the heating lamps and reflected by the reflecting plates to heat the interior of the drying vessel, so that the drying of the wafers W placed in the drying vessel is promoted.

4) The drying gas supply device for supplying a drying gas into the drying chamber is disposed in the drying chamber. Therefore, the wafers can perfectly and quickly be dried by making a drying gas envelop the wafers uniformly.

5) The first lifting means for vertically moving the top cover, and the second lifting means for vertically moving the wafer supporting means are ball screw mechanisms sharing common guide rails. Therefore, the construction of driving units for driving the top cover and the support means is simplified, and improves the accuracy of driving operations.

6) The rod connected to the wafer holding means is extended through the through hole formed in the top cover and is connected to the second lifting means, and the gap between the top cover and the rod is sealed by the sealing structure having the shape of an airtight, flexible, annular tube, and filled with a gas. Thus, the sealing of the gap between the top cover and the rod connected to the wafer holding means can be improved.

7) The first lifting means is provided with a stopper for limiting the upward movement of the wafer holding means relative to the top cover to prevent the wafer holding means from moving beyond an upper limit and colliding against the top cover. Thus, the safety and reliability of the cleaning and drying apparatus is enhanced.

8) The wafer holding means comprises the pair of lower support members for supporting the plurality of wafers in a vertical position at suitable intervals, and a pair of upper support members disposed beside a region above the lower support members, each of the lower support members has the rigid core and a support block of a synthetic resin resistant to different kinds of cleaning liquids, each of the lower support members is provided with grooves of a substantially V-shaped cross section for supporting wafers therein, and each of the upper support members is provided with grooves of a substantially Y-shaped cross section for preventing the wafers from tilting. Thus, the volume of the support members, i.e., the wafer holding means, can be reduced to the least possible extent. Accordingly, the cleaning tank need not be very large and has a predetermined cleaning liquid storing capacity, the cleaning and drying apparatus can be built in a small construction, and wafers can be stably supported.

Second Embodiment

A cleaning system in a second embodiment according to the present invention will be described with reference to FIGS. 21 to 35. The cleaning system 101 in the second embodiment shown in FIG. 21 has a wafer handling unit 102 which receives a carrying case C containing wafers (objects) W in a horizontal position, puts cleaned wafers W in the carrying case C and sends out the carrying case C containing the cleaned wafers W, and a cleaning unit 103 which cleans and dries a plurality of wafers W, for example, fifty wafers W corresponding to the capacity of two carrying cases C, in a batch processing system.

The wafer handling unit 102 has a table 104 on which a carrying case C containing, for example, twenty-five wafers W in a horizontal position is mounted. The wafer handling unit 102 has a wafer handling arm device 105, a guide device 106, a position converting device 107 and a holding device 108 to take out a wafer W from the carrying case C mounted on the table 104, to transfer the wafer W in a vertical position to the cleaning unit 103, to receive the cleaned wafer W and to store the cleaned wafer W in a horizontal position in the carrying case C.

The wafer handling arm device 105 carries a wafer W from the carrying case C to a first position a, and from the first position a to the carrying case C. The guide device 106 aligns a wafer W. The position converting device 107 converts a wafer W from a horizontal position to a vertical position while carrying the wafer W from the first position a to a second position b, and converts a wafer W from a vertical position to a horizontal position while carrying the wafer W from the second position b to the first position a. The holding device 108 carries a wafer W held in a vertical position from the second position b to a third position c, and from the third position c to the second position b.

When carrying a wafer W in a vertical position from the wafer handling unit 102 to the cleaning unit 103, first the wafer handling arm device 105 takes out a wafer W from a carrying case C, carries the wafer W in a horizontal position to the first position a and transfers the wafer W to the guide device 106. The guide device 106 aligns the wafer W, and then the guide device 106 transfers the wafer W to the position converting device 107 at the first position a. The position converting device 107 converts the wafer W from a horizontal position to a vertical position while carrying the wafer W to the second position b. The position converting device 107 transfers the wafer W to the holding device 108 at the second position b, the holding device 108 carries the wafer W in a vertical position to the third position c. Then, the wafer W is carried by a carrying device (carrying means) 110, which will be described later, from the third position c to the cleaning unit 103. After the wafer W has been cleaned, the foregoing wafer carrying procedure is reversed to put the wafer W in a horizontal position into the carrying case C.

The carrying device 110 is placed on the front side (the lower side in FIG. 21) of the cleaning unit 103 so as to slide longitudinally along the cleaning system 101.

The carrying device 110 is provided with a first support member 111, and tilt preventing members 112a and 112b. The carrying device supports a plurality of wafers W corresponding to the capacity of two carrying cases C, for example, fifty wafers W, on the first support member 111 and holds the wafers W in a vertical position by the tilt preventing members 112a and 112b. Thus, the plurality of wafers W are carried in a batch from the wafer handling unit 102 to the cleaning unit 103.

Figure 21:
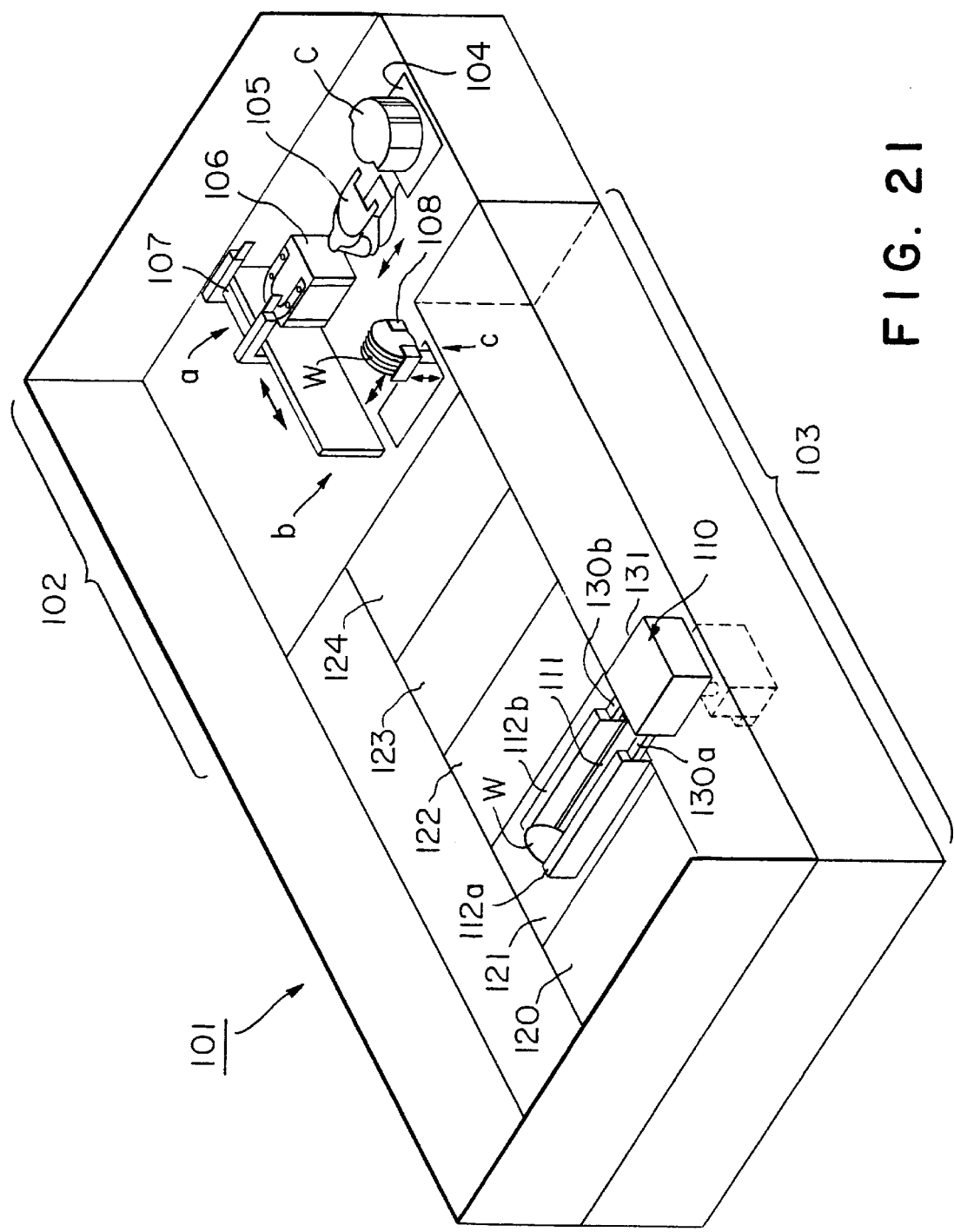
FIG. 21 is a schematic perspective view of a cleaning system in a second embodiment according to the present invention.

Arranged in the cleaning unit 103 from left to right, as viewed in FIG. 21, are a support member cleaning and drying tank 120 for cleaning and drying the first support member 111 and the tilt preventing members 112a and 112b of the carrying device 110, processing tanks 121, 122 and 123 for cleaning wafers W with cleaning liquids and rinsing wafers W with pure water, and a drying tank 124 for drying wafers W cleaned in the processing tanks 121 to 123 by using, for example, isopropyl alcohol vapor.

The arrangement and the combination of processing tanks may be optionally and selectively determined in compliance with processes to which wafers W are to be subjected and types of cleaning. For example, some of the foregoing processing tanks may be omitted or the cleaning unit 103 may be provided with some additional processing tanks.

Figure 22:
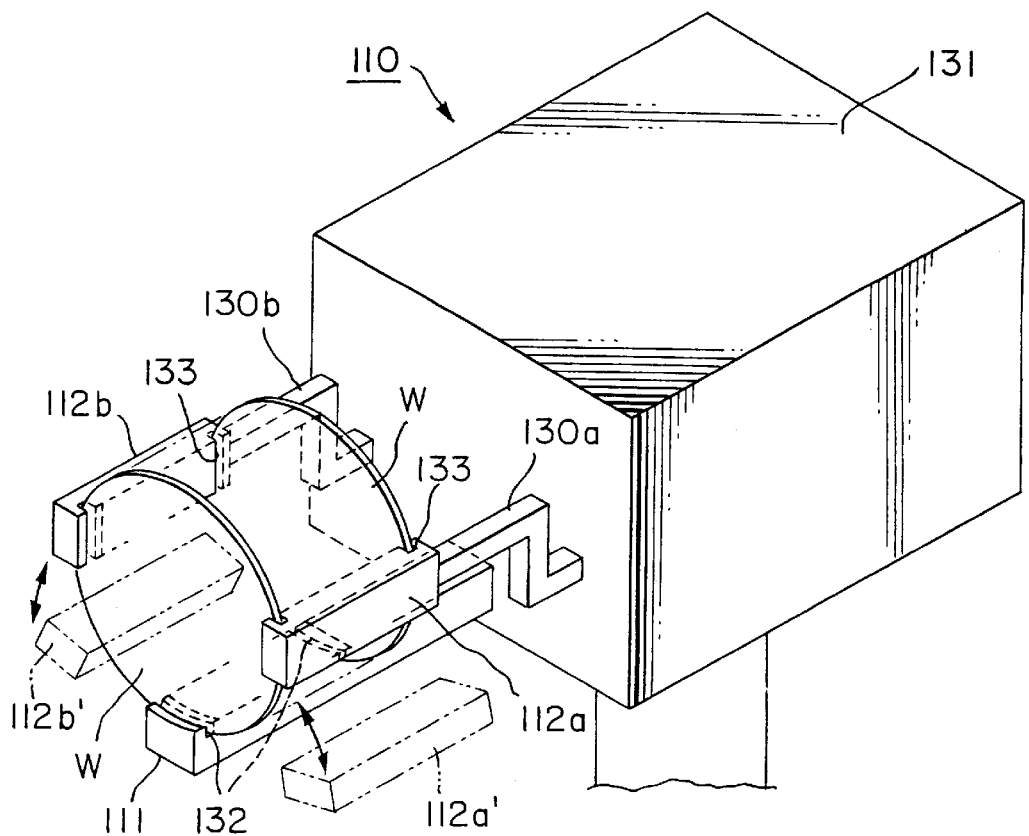
FIG. 22 is an enlarged schematic perspective view of a carrying device.

As shown in FIG. 22, the carrying device 110 capable of holding fifth wafers W has the first support member 111 for supporting fifty wafers W at lower sections of their peripheral portions, and the tilt preventing members 112a and 112b disposed on the opposite sides of the first support member 111.

Crankshafts 130a and 130b are connected to the base ends of the tilt preventing members 112a and 112b, respectively. The crankshafts 130a and 130b are turned by a turning mechanism, not shown, including a built-in motor contained in a base unit 131. The tilt preventing members 112a and 112b are turned simultaneously by the turning mechanism toward each other to upper positions corresponding to the circumferences of wafers W and away from each other to lower positions separated apart from the circumferences of wafers W, respectively. In FIG. 22, the tilt preventing members 112a and 112b indicated by continuous lines are in a state after the tilt preventing members 112a and 112b have been turned to the upper positions and have been brought into contact with diametrically opposite side sections of the circumferences of the wafers W, and the tilt preventing members 112a and 112b indicated by alternate long and short dash lines 112a' and 112b' are in a state after the tilt preventing members 112a and 112b have been turned away from each other to the lower positions and have been separated from wafers W.

The first support member 111 has an upper surface provided with grooves 132 to receive lower sections of peripheral portions of wafers W. The tilt preventing members 112a and 112b have inner surfaces provided with grooves 133 to receive side sections of peripheral portions of wafers W. When supporting wafers W on the carrying device 111, lower sections of peripheral portions of wafers W are inserted in the grooves 132 of the first support member 111, the tilt preventing members 112a and 112b are turned toward each other to the upper positions by the turning mechanism so that the grooves 133 of the tilt preventing members 112a and 112b receive side sections of the peripheral portions of the wafers W, respectively, to prevent the wafers W from tilting.

Figure 23:
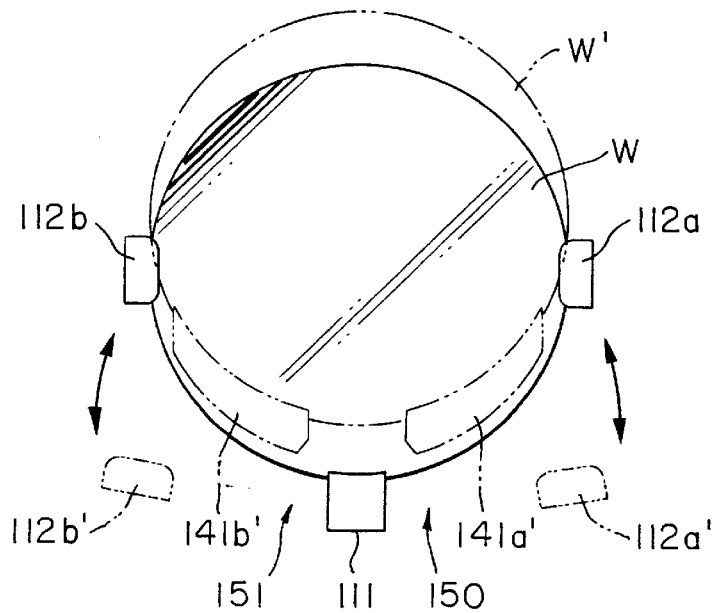
FIG. 23 is a diagrammatic view of assistance in explaining operations for transferring wafers from the carrying device to the wafer holding means and from the latter to the former.

The tilt preventing members 112a and 112b indicated by continuous lines in FIG. 23 are in a state after the tilt preventing members 112a and 112b have been turned by the turning mechanism contained in the base unit 131 to the upper positions and have received diametrically opposite side sections of peripheral portions of the wafers W in the grooves 133 thereof to prevent the wafers W from tilting. The tilt preventing members 112a and 112b indicated by alternate long and short dash lines 112a' and 112b' in FIG. 23 are in a state after the tilt preventing members 112a and 112b have been turned by the turning mechanism contained in the base unit 131 away from each other to the lower positions on substantially the same level as the first support member 111.

Figure 24:
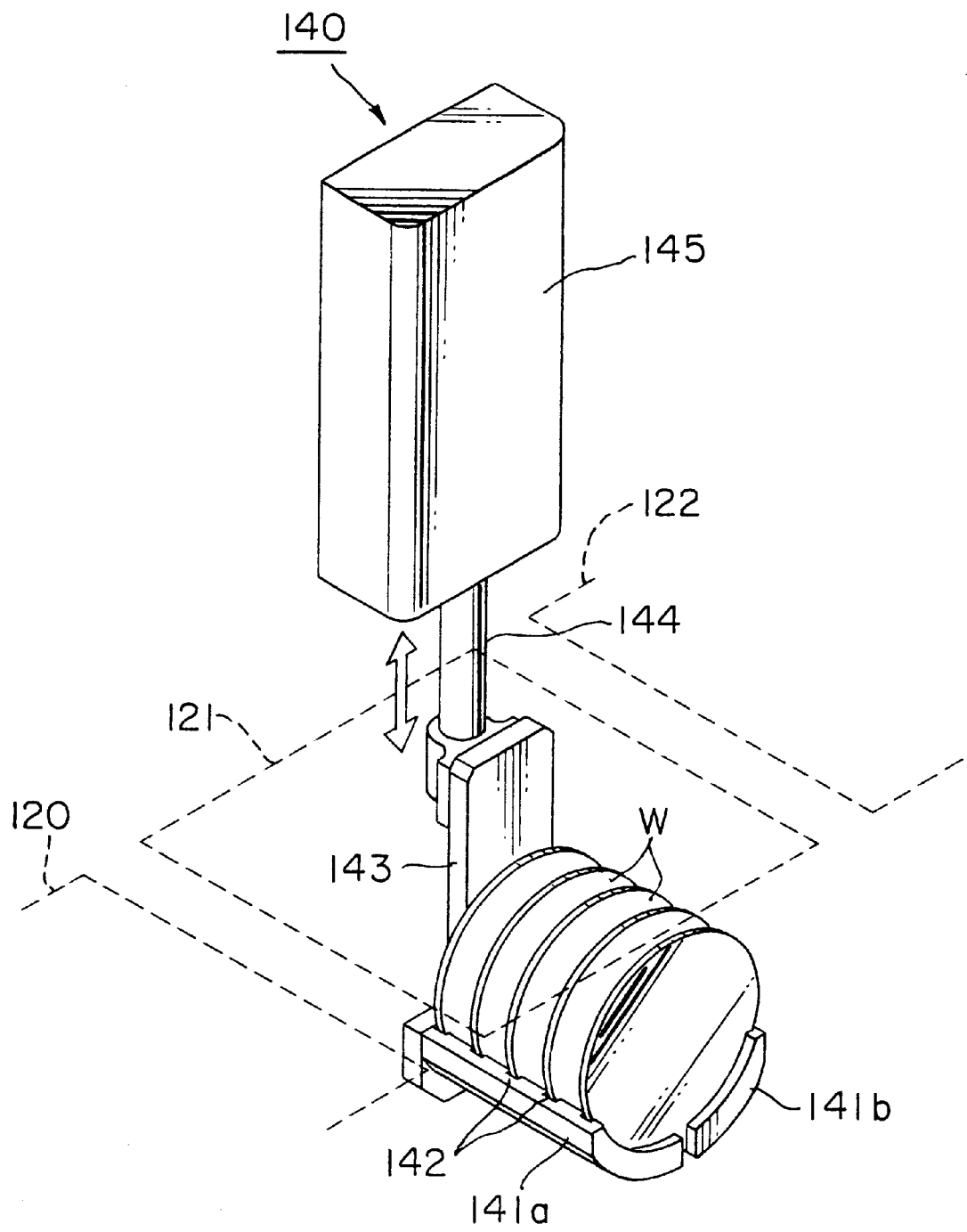
FIG. 24 is a perspective view of the wafer holding means.

As shown in FIG. 24, each of the processing tanks 121, 122 and 123 is provided with a wafer holding device (object holding means) 140. Since wafer holding devices 140 combined with the processing tanks 121, 122 and 123 are the same in construction, only the wafer holding device 140 combined with the processing tank 121 will be explained.

Referring to FIG. 24, the wafer holding device 140 is provided with a pair of second support members 141a and 141b to support fifty wafers W corresponding to the capacity of two carrying cases C. The second support members 141a and 141b have upper surfaces provided with grooves 142 to receive lower sections of peripheral portions of wafers W. The pitches of the grooves 142 of the second support members 141a and 141b, the grooves 132 of the first support member 111 and the grooves 133 of the tilt preventing members 112a and 112b are the same.

The second support members 141a and 141b are fixed in a horizontal position to a T-shaped holding member 143, and a lifting rod 144 is attached to the back surface of the holding member 143. The lifting rod 144 is connected to a lifting mechanism, not shown, of a lifting mechanism 145 including a motor. The lifting mechanism 145 moves the second support members 141a and 141b between a position in the processing tank 121 and a transfer position above the processing tank 121.

FIG. 25 is a plan view illustrating the positional relation between the first support member 111 and the tilt preventing members 112a and 112b of the carrying device 110 located above the processing tank 121, and the second support members 141a and 141b. As is obvious from FIG. 25, the second support member 141a lies in a space 150 between the first support member 111 and the tilt preventing member 112a, and the second support member 141b lies in a space 151 between the first support member 111 and the tilt preventing member 112b. Thus, the second support members 141a and 141b move, respectively, through the spaces 150 and 151, when the second support members 141a and 141b are moved vertically with the carrying device 110 located above the processing tank 121.

If the second support members 141a and 141b are raised to a level above the processing tank 121 with the first support member 111 and the tilt preventing members 112a and 112b supporting wafers W located above the processing tank 121, the second support members 141a and 141b are raised through the spaces 150 and 151 as shown in FIG. 23 to a level above that of the first support member 111. Consequently, the second support members 141a and 141b receive the wafers W thereon from below as indicate by Of alternate long and short dash lines 141a' and 141b' in FIG. 23 to receive the wafers W from the first support member 111 and the tilt preventing members 112a and 112b. If the second support members 141a and 141b thus supporting the wafers W are lowered through the spaces 150 and 151 to their lower positions in the processing tank 121, the wafers W are transferred from the second support members 141a and 141b to the first support member 111. The arrangement of the first support member 111 and the tilt preventing members 112a and 112b, and that of the second support members 141a and 141b are determined so that the first support member 111 and the tilt preventing members 112a and 112b, and the second support members 141a and 141b may not interfere with each other to enable the transfer of wafers W from the first support member 111 to the second support members 141a and 141b, and from the latter to the former. The processing tanks 122 and 123 are provided with wafer holding devices 140, similarly to the wafer holding device 140 combined with the processing tank 121.

Processes for processing the wafers W to be carried out by the cleaning system will be explained hereinafter. A carrying robot, not shown, carries a first carrying case C containing, for example, twenty-five wafers W to be cleaned to and places the same on the table 104 of the wafer handling unit 102. The wafers W are taken out from the first carrying case C, are aligned, and are mounted on the holding device 108. The first carrying case C thus emptied is carried away, a second carrying case C containing the wafers W to be cleaned is mounted on the table 104, and then the same process is repeated to mount the fifty wafers W on the holding device 108.

Subsequently, the first support member 111 and the tilt preventing members 112a and 112b of the carrying device 110 cleaned and dried in the support member cleaning and drying tank 120 receive the fifth wafers W in a batch from the holding device 108, and the carrying device 110 carries the fifty wafers W from the wafer handling unit 102 to the cleaning unit 103. The wafers W are processed sequentially in the processing tanks 121, 122 and 123 to remove organic contaminants and impurities including particles from the wafers W.

A process to be carried out in the processing tank 121 will be described with reference to FIGS. 26 to 36. As shown in FIG. 26, the carrying device 110 carries the fifty parallel wafers W in a vertical position to a transfer position above the processing tank 121. As mentioned above in connection with FIG. 22, the wafers W are supported on the first support member 111 and are prevented from tilting by the tilt preventing members 112a and 112b when carrying the wafers W. At this stage, the second support members 141a and 141b are held at the lower positions in the processing tank 121 by the lifting mechanism 145. The carrying device 110 is stopped at a transfer position above the processing tank 121 as shown in FIG. 27. In this state, the first support member 111 and the tilt preventing members 112a and 112b are located so as not to overlap the second support members 141a and 141b, as viewed in plan view, as mentioned previously in connection with FIG. 25.

Then, as shown in FIG. 28, the lifting mechanism 145 is operated to raise the second support members 141a and 141b to a level higher than that of the first support member 111. Consequently, lower sections of peripheral portions of the wafers W are seated on the second support members 141a and 141b, so that the wafers W are transferred from the first support member 111 and the tilt preventing members 112a and 112b to the second support members 141a and 141b as mentioned in connection with FIG. 23. Then, as shown in FIG. 29, the tilt preventing members 112a and 112b are turned downward to the level of the first support member 111, so that the first support member 111 and the tilt preventing members 112a and 112b are on a level lower than that of the second support members 141a and 141b. Then, as shown in FIG. 30, the first support member 111 and the tilt preventing members 112a and 112b of the carrying device 111 are moved horizontally to retract the same from the transfer position above the processing tank 121. Since the first support member 111 and the tilt preventing members 112a and 112b are on the level lower than that of the second support members 141a and 141b, the tilt preventing members 112a and 112b can be moved horizontally away from the transfer position above the processing tank 121 without being interfered with by the second support members 141a and 141b. Subsequently, the lifting mechanism 145 is operated to lower the second support members 141a and 141b supporting the wafers W into the processing chamber 121.

The wafers W are subjected to a predetermined cleaning process in the processing tank 121, and then the wafers W are taken out from the processing tank 121 by the following procedure.

As shown in FIG. 32, the lifting mechanism 145 raises the second support members 141a and 141b to the transfer position above the processing tank 121. As shown in FIG. 33, the first support member 111 and the tilt preventing members 112a and 112b of the carrying device 110 are moved horizontally to the transfer position above the processing tank 121 with the tilt preventing members 112a and 112b held on the same level as the first support member 111. At this stage, the first support member 111 and the tilt preventing members 112a and 112b are on a level lower than that of the second support members 141a and 141b, and hence the first support member 111 and the tilt preventing members 112a and 112b can be horizontally moved to the transfer position above the processing tank 121 without being interfered with by the second support members 141a and 141b.

Figure 36:
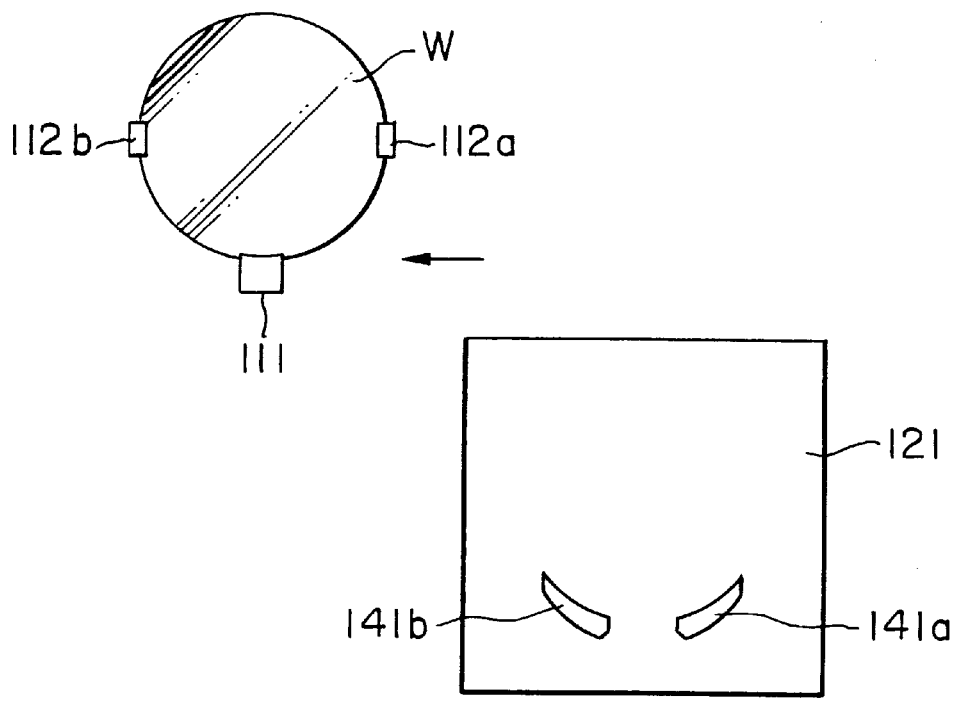
FIG. 36 is a diagrammatic view illustrating a process of carrying the wafers away from the transfer position above the processing tank.

Then, as shown in FIG. 34, the tilt preventing members 112a and 112b are turned upward to positions corresponding to side sections of peripheral portions of the wafer W. Then, as shown in FIG. 35, the wafer holding device 140 lowers the second support members 141a and 141b into the processing tank 121. Consequently, the wafers W are seated on the first support member 111 with the side sections of peripheral portions thereof supported on the tilt preventing members 112a and 112b. Thus, the wafers W are transferred from the second support members 141a and 141b to the carrying device 110. Then, as shown in FIG. 36, the first support member 111 and the tilt preventing members 112a and 112b of the carrying device 110 are moved horizontally away from the transfer position above the processing tank 121 to a transfer position above the next processing tank 122.

Thus, the wafers W are handled in the same manner for cleaning processes in the processing tanks 122 and 123.

After the wafers W have been thus cleaned, the wafers W are dried in the drying tank 124. After the completion of the predetermined processes for cleaning the wafers W in the processing unit 103, the fifty wafers W are carried and transferred to the holding device 108 by the carrying device 110. The twenty-five wafers W are transferred from the holding device 108 to a first carrying case C in a horizontal position, and then the thus loaded first carrying case C is sent out from the cleaning system 101. Then, an empty second carrying case C is supplied to the cleaning system 101, the remaining twenty-five wafers W are transferred from the holding device 108 to the second carrying case C, and then the thus loaded second carrying case C is sent out from the cleaning system.

Thus, in the cleaning system 101 in the second embodiment according to the present invention, the tilt preventing members 112a and 112b are moved to positions where the tilt preventing members 112a and 112b may not touch the wafers W and the second support members 141a and 141b, the second support members 141a and 141b of the wafer holding device 140 are raised to a level slightly higher than that of the first support member 111 to transfer the wafers W from the carrying device 110 to the wafer holding device 140 and from the latter to the former.

Accordingly, only a small space is necessary for raising the second support members 141a and 141b of the wafer holding device 140 and hence the cleaning system can be formed in a small construction. The distance by which the second support members 141a and 141b of the wafer holding device 140 is reduced and hence time necessary to raise the second support members 141a and 141b is reduced accordingly, which improves the throughput of the cleaning system. Consequently, the productivity of the associated semiconductor device fabricating process can be improved. The tilt preventing members 112a and 112b may be raised to a level higher than the upper extremities of wafers W' indicated by an alternate long and short dash line in FIG. 23. A state where the tilt preventing members 112a and 112b are thus raised beyond the upper extremities of the wafers W enables, like a state where the tilt preventing members 112a and 112b are lowered to the level of the first support member 111, the carrying device to be moved horizontally without being interfered with by the wafers W and the second support members 141a and 141b. Although the present invention has been described as applied to the cleaning system for cleaning wafers, by way of example, the present invention is applicable to a processing system for processing substrates for LCDs, processing systems for carrying out processes other than a cleaning process and the like, and to carrying out processing methods.

Figure 37:
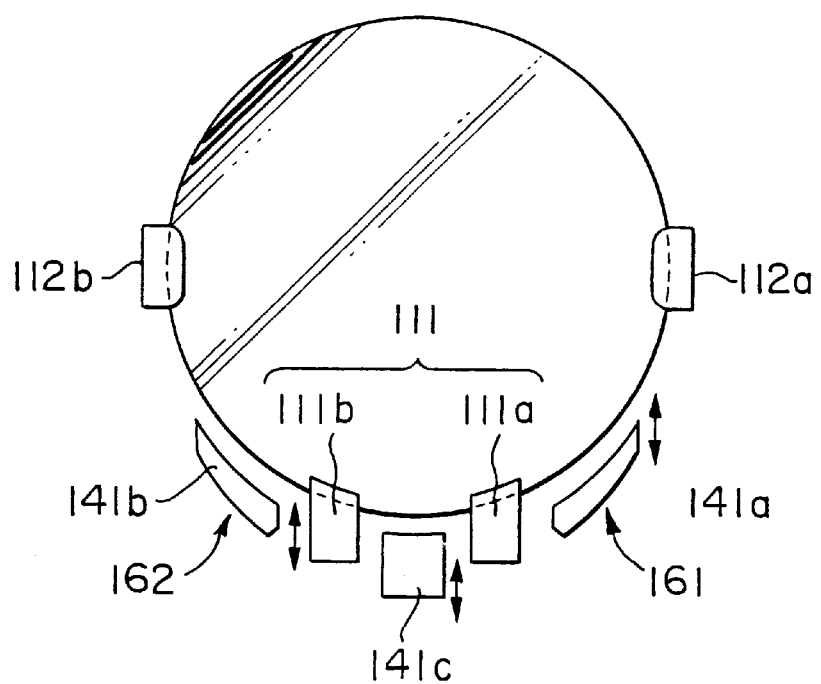
FIG. 37 is a view illustrating a procedure for transferring the wafers from a first support structure consisting of a plurality of support members and a tilt preventing structure consisting of a plurality of tilt preventing members to second support members, and from the latter to the former.

Although the cleaning system in the second embodiment employs only the first support member 111 for supporting the wafers W, a plurality of support members, such as two support members 111a and 111b as shown in FIG. 37, may be employed instead of the first support member 111. If the two support members 111a and 111b are employed, the support members 111a and 111b are spaced apart to provide a space 160 therebetween, a space 161 is formed between the support member 111a and the tilt preventing member 112a, and a space 162 is formed between the support member 111b and the tilt preventing member 112b. The wafer holding device 140 may be provided with a second support member 141c in addition to the second support members 141a and 141b. When the wafer holding device 140 is moved vertically with the carrying device located at the transfer position above the processing tank 121, the second support members 141a, 141b and 141c are able to move through the spaces 161, 162 and 160, respectively.

According to the present invention, the distance by which the support members of the holding means are to be raised is reduced to the least possible extent and thereby the processing apparatus can be formed in a relatively small height, and time necessary for transferring wafers can be shortened. Accordingly, the cleaning and drying apparatus can be built in a relatively small size and the throughput of the cleaning and drying apparatus can be improved. Thus, according to the present invention, the wafers can be smoothly processed, and the yield of, for example, a semiconductor device fabricating process can be improved.

What is claimed is:

1. A cleaning and drying apparatus comprising:
    a cleaning tank for cleaning an object therein, having an opening on an upper side and defining a cleaning chamber;
    a drying unit for drying the object, defining a drying chamber and disposed above the cleaning tank;
    object holding means for holding the object and moving the object between the cleaning tank and the drying unit;
    wherein the drying unit has a liftable top cover capable of being vertically moved relative to the cleaning tank; and
    wherein carrying means capable of carrying the object in horizontal directions is disposed for transferring the object from the carrying means to the object holding means, and from the latter to the former; and
    wherein the carrying means comprises support members to support the object at lower sections of their peripheral portions; and
    tilt preventing members disposed, respectively, on outer sides of the support members to support the object at opposite side sections of their peripheral portions.

2. A cleaning and drying apparatus comprising:
    a cleaning tank for cleaning an object therein, having an opening on an upper side and defining a cleaning chamber;
    a drying unit for drying the object, defining a drying chamber and disposed above the cleaning tank;
    object holding means for holding the object and moving the object between the cleaning tank and the drying unit;
    wherein the drying unit has a liftable top cover capable of being vertically moved relative to the cleaning tank; and
    wherein the drying unit has a fixed base disposed under the liftable top cover, and a sealing member is interposed between the liftable top cover and the fixed base.

3. The cleaning and drying apparatus according to claim 2, wherein
    a shutter is disposed so as to cover the opening of the cleaning tank to isolate the cleaning chamber and the drying chamber from each other.

4. A cleaning and drying apparatus comprising:
    a cleaning tank for cleaning an object therein, having an opening on an upper side and defining a cleaning chamber;
    a drying unit for drying the object, defining a drying chamber and disposed above the cleaning tank;
    object holding means for holding the object and moving the object between the cleaning tank and the drying unit;
    wherein the drying unit has a liftable top cover capable of being vertically moved relative to the cleaning tank; and
    wherein the liftable top cover is a quartz member having a cross section of a shape resembling an inverted letter U.

5. The cleaning and drying apparatus according to claim 4, wherein
    the drying unit has a fixed base disposed under the liftable top cover, and the fixed base and the cleaning tank are made of quartz.

6. The cleaning and drying apparatus according to claim 4, wherein
    heating elements are arranged outside the liftable top cover, and reflecting plates are disposed behind the heating elements.

7. A cleaning and drying apparatus comprising:
    a cleaning tank for cleaning an object therein, having an opening on an upper side and defining a cleaning chamber;

a drying unit for drying the object, defining a drying chamber and disposed above the cleaning tank;

object holding means for holding the object and moving the object between the cleaning tank and the drying unit;

wherein the drying unit has a liftable top cover capable of being vertically moved relative to the cleaning tank;

a drying gas supply device for supplying a drying gas into the drying chamber; and wherein the drying unit has a fixed base disposed under the lifting top cover, and the drying gas supply device is disposed on the fixed base.

8. The cleaning and drying apparatus according to claim 7, wherein the drying gas supply device supplies a drying gas from side regions of the drying chamber upward.

9. The cleaning and drying apparatus according to claim 7, wherein the drying unit is provided with a drying gas discharging means.

10. The cleaning and drying apparatus according to claim 7, wherein the drying gas is an inert gas.

11. The cleaning and drying apparatus according to claim 7, wherein the drying gas is an organic solvent gas or a mixed gas of an inert gas and an organic solvent gas.

12. A cleaning and drying apparatus comprising:

a cleaning tank for cleaning an object therein, having an opening on an upper side and defining a cleaning chamber;

a drying unit for drying the object, defining a drying chamber and disposed above the cleaning tank;

object holding means for holding the object and moving the object between the cleaning tank and the drying unit;

wherein the drying unit has a liftable top cover capable of being vertically moved relative to the cleaning tank;

a first lifting means for vertically moving the liftable top cover, and a second lifting means for vertically moving the object holding means;

wherein the first and second lifting means comprises ball screw mechanisms which drive slide blocks for sliding motion along common guide rails.

13. The cleaning and drying apparatus according to claim 12, wherein the object holding means is connected to the second lifting means by a rod extended through a through hole formed in the liftable top cover, and a gap between the liftable top cover and the rod is sealed with a sealing structure having the shape of an airtight, flexible, annular tube, and filled with a gas.

14. The cleaning and drying apparatus according to claim 12, wherein the first lifting means is provided with a stopper for limiting the upward movement of the second lifting means and the object holding means relative to the first lifting means.

15. The cleaning and drying apparatus according to claim 2, wherein the object holding means comprises a pair of lower support members for supporting the objects in a vertical position at suitable intervals, and a pair of support members disposed above the lower support members, each of the lower support members has a rigid core and a support block surrounding the rigid core, made of a synthetic resin resistant to different kinds of cleaning liquids, each of the lower support members is provided with grooves of a substantially V-shaped cross section for receiving the object therein, and each of the upper support members is provided with grooves of a substantially Y-shaped cross section for preventing the object from tilting.

* * * * *